United States Patent [19]
Mori et al.

[11] Patent Number: 6,136,214
[45] Date of Patent: Oct. 24, 2000

[54] PLASMA PROCESSING METHOD AND APPARATUS

[75] Inventors: Masahito Mori, Kokubunji; Shinichi Tachi, Sayama; Kenetsu Yokogawa, Hachioji, all of Japan

[73] Assignee: Hitachi, Ltd., Tokyo, Japan

[21] Appl. No.: 08/840,647

[22] Filed: Apr. 25, 1997

[30] Foreign Application Priority Data

Apr. 26, 1996 [JP] Japan ................................ 8-106802
Dec. 26, 1996 [JP] Japan ................................ 8-347139

[51] Int. Cl.$^7$ ................................ B44C 1/22; C23F 1/02
[52] U.S. Cl. ................................ 216/67; 156/345; 216/68; 118/723 R
[58] Field of Search ................................ 156/345; 118/723 I, 118/723 E, 723 R; 216/67, 68

[56] References Cited

U.S. PATENT DOCUMENTS

| | | | |
|---|---|---|---|
| 5,477,975 | 12/1995 | Rice et al. | 156/345 |
| 5,556,501 | 9/1996 | Collins et al. | 156/345 |
| 5,772,832 | 6/1998 | Collins et al. | 156/345 |

*Primary Examiner*—Thi Dang
*Attorney, Agent, or Firm*—Antonelli, Terry, Stout & Kraus, LLP

[57] ABSTRACT

Because of environmental pollution prevention laws, PFC (perfluorocarbon) and HFC (hydrofluorocarbon), both etching gases for silicon oxide and silicon nitride films, are expected to be subjected to limited use or become difficult to obtain in the future. To accommodate such a problem, an etching gas containing fluorine atoms is introduced into a plasma chamber. In a region where plasma etching takes place, the fluorine-containing gas plasma is made to react with solid-state carbon in order to produce a molecular chemical species such as $CF_4$, $CF_2$, $CF_3$ and $C_2F_4$ for etching. This method assures a high etching rate and high selectivity while keeping a process window wide.

30 Claims, 21 Drawing Sheets plasma condition at measurement
CF$_4$                0.5mTorr
a magnetron current  280mA

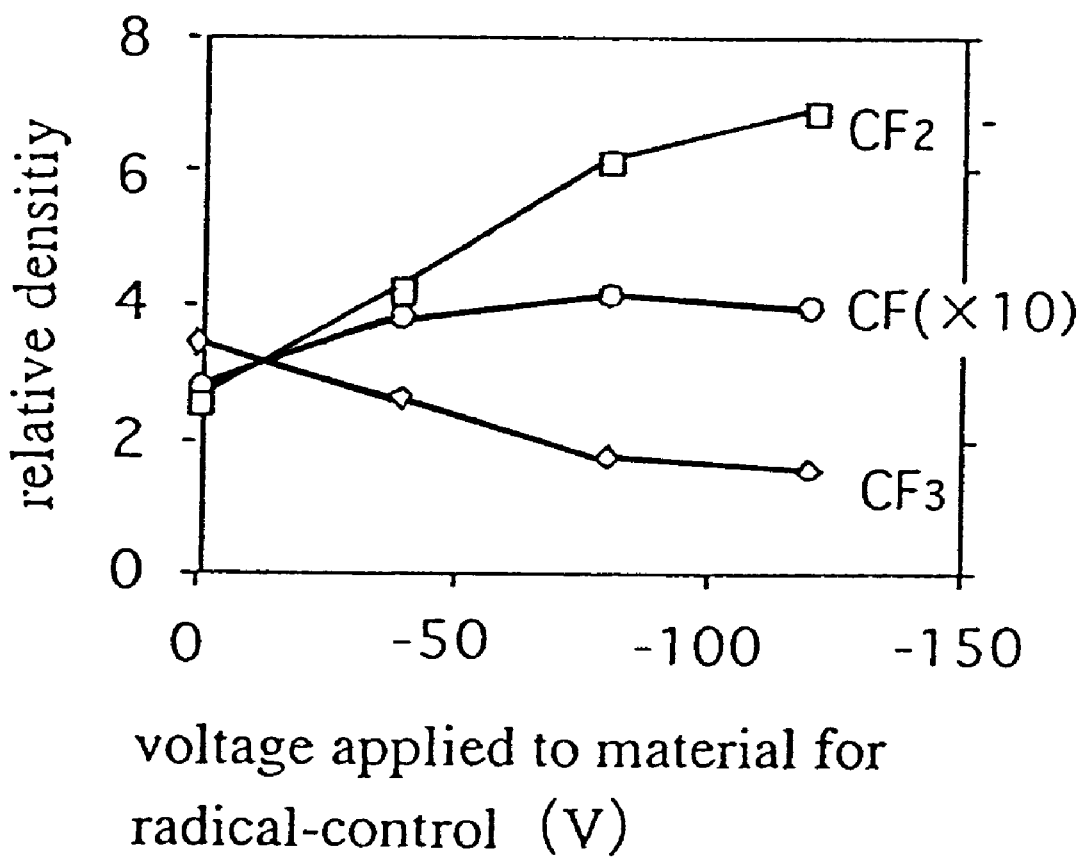

etching time

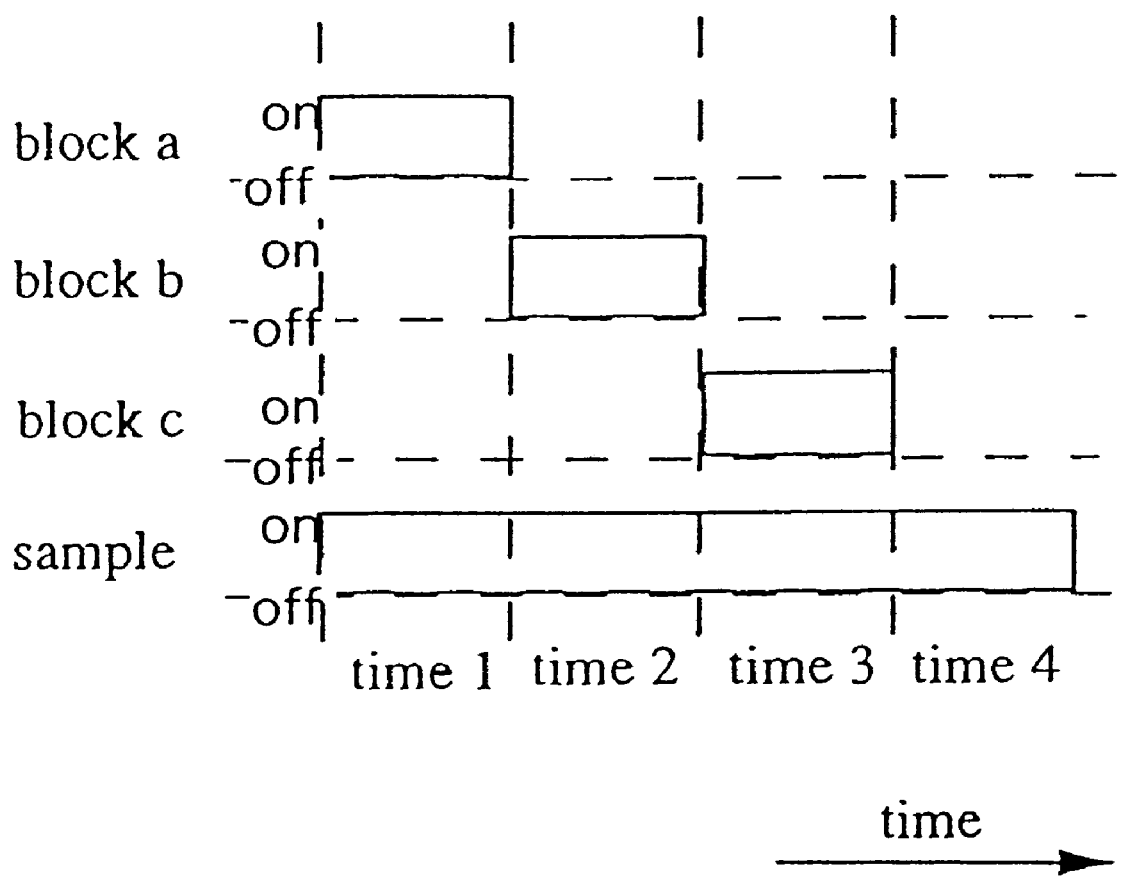

time 1 time 2

- 1501
- 1502
- 1503
- 1504
- 1505

1506

1507

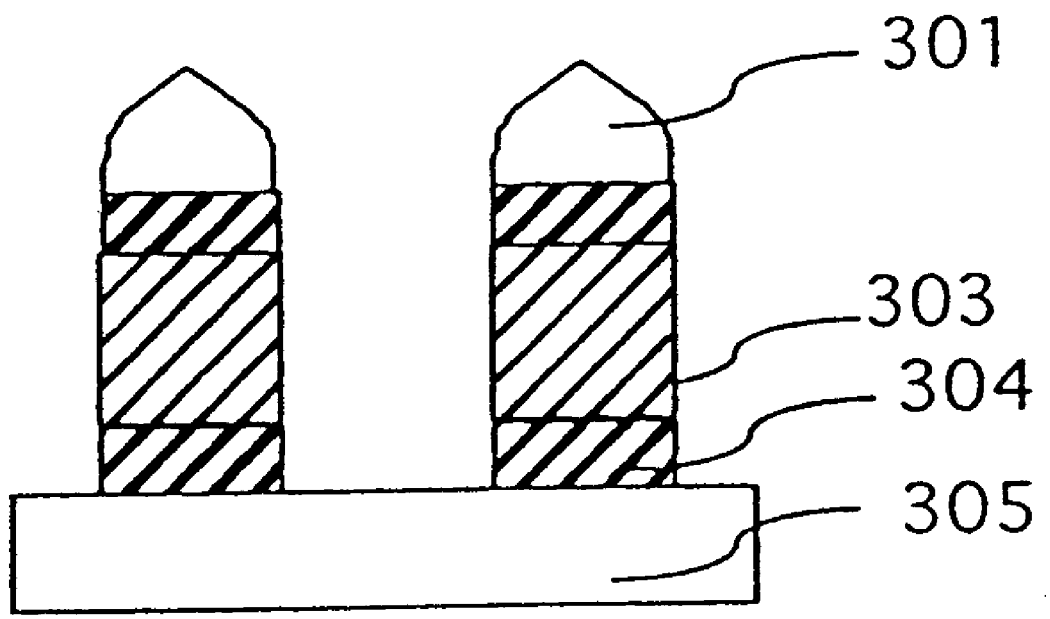

PLASMA PROCESSING METHOD AND APPARATUS

BACKGROUND OF THE INVENTION

The present invention relates to a plasma processing method and a plasma processing apparatus and, more specifically, to plasma etching used for a dry etching process that ionizes a source gas in a gas phase and processes the surface of a semiconductor material by physical or chemical reaction of highly activated particles of the plasma.

With the advance of miniaturization of semiconductor devices in recent years, there has been a growing tendency to form a wiring layer in multiple layers and to make the device structure three-dimensional. Under these circumstances, the fabrication of an isolation film used to keep wires and devices electrically isolated from one another has come to play an increasingly important role in the device manufacture. Etching of a silicon oxide film, the isolation film, has been done by using perfluorocarbon gas (PFC), such as $CF_4$ and $C_2F_8$, and hydrofluorocarbon gas (HFC), such as $CH_2$ and $CHF_3$. This is because a carbon-containing gas is needed to cut off an Si—O bond of the silicon oxide film and generate a volatile compound.

As global environmental concerns are attracting growing attention, PFC and HFC are expected to be subjected to limited use or become difficult to obtain in the future because these gases easily absorb infrared rays, stay in atmosphere for as long as 3000 years and thus contribute greatly to the greenhouse effects on the earth.

The PFC and HFC gas plasmas contain fluorine, fluorocarbon radicals such as $CF_1$, $CF_2$ and $CF_3$, and ions. An etching mechanism of a silicon oxide film operates as follows. These reactive species (e.g., radicals) stick to the surface of the silicon oxide film to be etched. The energy of ions incident on the surface gives rise to a localized quasi-high temperature condition, under which volatile products are formed by chemical reaction. Hence, to obtain good etching characteristics requires controlling the reactive species incident on a sample intended for etching and also controlling the energy and density of ions impinging on the sample. The control of the reactive species and of the density of ions in the plasma has been conducted by a plasma producing system in the etching equipment.

To generate reactive species in a reactor, Japanese etched and also discloses arranging a heater around the periphery of the reactor to alleviate plasma's thermal shocks on the ceramics reactor.

When PFC and HFC gas plasmas are used, fluorocarbon- or carbon-based polymers adhere to the inner wall of the reaction chamber as the etching process of the sample proceeds. A method of removing the adhering polymers is known, which, as described in Japanese Patent Laid-Open No. 62936/1993, involves the installation of split, multiple electrodes-isolated from an outer wall of the reaction chamber-on the inner wall of the reaction chamber and the application of a radio frequency (RF) voltage between plasma generating electrodes successively to perform plasma cleaning. Further, Japanese Patent Laid-Open No. 231320/1989, 231321/1989 and 231322/1989 describe plasma cleaning methods which involve applying a voltage to electrodes electrically isolated with respect to the outer wall of the reaction chamber.

If such a conventional plasma cleaning is performed, there still will be particles adhering to the inner wall of the reaction chamber before the next cleaning operation. Because fluorine in the plasma reacts with the adhering layer on the inner wall of the reaction chamber, the fluorine density in the plasma decreases gradually, increasing the ratio of carbon in the plasma. That is, as a growing amount of particles adheres to the inner wall of the reaction chamber, the radical composition changes, causing a time-dependent change in etching characteristic, which poses a serious problem.

Etching equipment can be classified, according to the plasma producing system, into a capacitive coupling type, an ECR (electron cyclotron resonance) type, an ICP (induced coupling) type, and a surface wave excitation type. In the capacitive coupling type etching equipment, a material to be etched is placed on a bottom electrode and two voltage application systems apply differing frequencies and voltage to the upper electrode and the bottom electrode to control the plasma generation and the energy incident on the sample. The structure of this equipment, however, does not allow independent control of plasma generation and incident energy. The control of excited species in this equipment is considered to be performed by carbon or silicon used in the electrodes. However, no parameters on this control are available. Hence, it is necessary to perform three controls, i.e., control of the ion density, control of the energy of ions incident on the material being etched and control of reactive species, by controlling two, upper and lower, power supplies. Therefore, the range of parameters in which satisfactory etching characteristics can be obtained (defined as a process window) is narrow, making it difficult to produce stable etching conditions. The parameters that determine the etching characteristics include, in the plasma generation system, for example, RF power and microwave power applied between the electrodes, gas flow rate, gas pressure and gas composition. In the incident ion energy control, the etching characteristic determining parameters include the waveform and the frequency of the applied voltage and power.

In the plasma generation methods other than the capacitive coupling type, although the plasma generation control and the energy control of ions incident on the sample can be performed independently of each other, the mechanism for controlling the reactive species depends on the plasma generation control. Hence, these plasma generation methods have a drawback of having a narrow process window. In more detail, when a silicon oxide film of SAC (self-aligned contact) is processed in the high density plasma etching equipment, such as an ECR, there is a problem of a tradeoff between etch stopping at the bottom of holes and over-etching into a silicon nitride film. Further, the use of a high density plasma to perform a highly selective etching gives rise to another problem, a micro-loading phenomenon or RIE lag, in which the etching rate decreases as the hole diameters decrease, and an inverted micro-loading phenomenon or inverted RIE lag. Further, when metal films, such as TiN and Al laminated layers, are etched using this equipment, localized abnormal side-etched portions are formed (notching) at the boundary between different materials, such as TiN and Al.

Furthermore, with the method described in Japanese Patent Laid-Open No. 74147/1995, it is not possible to control the appropriate amount of excited species, making it difficult to perform an intended etching. The method disclosed in Japanese Patent Laid-Open No. 363021/1992 has a drawback of not being able to generate reactive species in the reactor.

SUMMARY OF THE INVENTION

The above problems can be solved by generating an exact amount of reactive species required for the etching in a region where the plasma comes into contact with the material to be etched.

This is detailed in the following. In the process of etching a silicon oxide film and a silicon nitride film on the sample to be processed, a gas containing fluorine, for example, is introduced into the reaction chamber, which is kept at a low gas pressure of 0.3 Pa to 200 Pa. An electric discharge is produced in the gas by applying an input power in the microwave and RF wave ranges to the gas to generate a plasma. Then, a solid material containing carbon, which is installed in the region where it contacts the plasma, has a DC or RF voltage applied thereto to release a required amount of carbon, thereby transforming fluorine radicals in the plasma into fluorocarbon radicals such as $CF$, $CF_2$, $CF_3$, $CF_4$ for etching the material.

A gas containing fluorine, but not carbon, is introduced into the reaction chamber where the fluorine-containing gas reacts with the solid carbon allowing the silicon oxide film and silicon nitride film to be selectively etched without using PFC or HFC. That is, a plasma is produced from a fluorine gas not containing carbon and fluorine atom ions are made to react with solid carbon installed in the reaction chamber to produce compounds of carbon and fluorine, such as $CF_4$, $CF_2$, $CF_3$ and $C_2F_3$. These compounds, radical molecules, have conventionally been able to be generated directly from dissociation of the PFC gas. These radical molecules thus generated have been used for etching the silicon oxide film.

The present invention is characterized in that reactive species required for etching the silicon oxide film and silicon nitride film are not supplied directly from PFC or HFC gas, but rather are generated from reaction with the solid carbon in the plasma chamber. This method makes it possible to generate reactive species necessary for etching so that the etching can be performed while maintaining selectivity as in the conventional process, even when the use of PFC and HFC gas is restricted or prohibited.

As for the improvement of selectivity and process margin during the process of making self-aligned contacts, this can be achieved by transforming reactive species into a single species of CF2, the etchant for the silicon oxide film. We have found that using carbon as the material for radical control and arranging it on the boundary surface with plasma can reduce the amount of fluorine in the plasma to one-half and increase $CF_1$, $CF_2$ and $CF_3$ fivefold, tenfold and twofold, respectively, when compared to the case where aluminum is used as the radical control material. This is shown in FIG. 2, which illustrates the result of measurement of fluorine and $CF_2$ in a $CF_4$ plasma when Al, $SiO_2$ and C are used for the radical control materials. The result indicates that when aluminum is used as the radical control material, there is no reaction with fluorine so that the fluorine atom density is large and that when carbon is used, the fluorine atom density is reduced to one-half. This means that a conversion reaction is considered to have occurred in which the carbon as the radical control material reacts with fluorine in the plasma to increase $CF_2$. It is also found that during this process $CF_1$, and $CF_2$ have also increased. The fact that the use of $SiO_2$ as the radical control material has resulted in reductions in $CF_1$, $CF_2$ and $CF_3$ indicates that chemical reactions have occurred between $CF_1$, $CF_2$ and $CF_3$ and the radical control material, $SiO_2$. In this way, by placing in the plasma region a radical control material that reacts with reactive species in the plasma to produce volatile products, it is possible to transform the radical composition in the plasma. The use of silicon and silicon carbide for the radical control material, too, is found to cause chemical reactions that generate volatile products such as $SiF_2$, thereby reducing fluorine in the plasma.

It was also found that the transforming of reactive species into a single selected species can be promoted by installing a voltage application system on the radical control material and applying a voltage to the radical control material during the sample etching. FIG. 3 shows densities of radicals, $CF_1$, $CF_2$ and $CF_3$, measured by applying a negative DC voltage to carbon, the radical control material, in a $CF_4$ gas plasma. It was found that as the applied voltage increases, $CF_3$ decreases and $CF_2$ increases. This phenomenon results from an ion-assisted reaction on the radical control material. Because of this phenomenon, fluorine in the plasma is transformed into $CF_2$ and the plasma containing a single reactive species enables selective etching, in which reaction products on the silicon oxide film evaporate allowing the etching of the silicon oxide film to continue, whereas residual materials on the silicon nitride film stop the etching. This eliminates a problem of shoulder etching of the nitride film that would occur due to reduced selectivity. While the conventional etching balances carbon and fluorine, this invention is characterized by the use of $CF_2$, which has a lower sticking parameter for sidewalls of the features being etched than that of carbon. This has been found to suppress the micro-loading and inverted micro-loading phenomena.

When etching samples having materials with largely differing etch rates, the following steps are taken. For the radical control material we use a compound which includes the same elements as those of the materials to be etched or at least one of the same elements as those of the etched materials. Depending on the material to be etched, the voltage applied to the radical control material is controlled according to the etching time or by monitoring the consumption or release of a certain kind of radical from the radical control material. This process is found to minimize localized abnormal deformations that would occur between different materials.

The problem of local deformations between different materials during metal etching can be solved by minimizing variations of the etchant. That is, this problem was able to be eliminated by using a radical control material having the same components as the material being etched and controlling the density of radicals according to the etching time or the monitoring of the result of radicals.

The time-dependent change of etching characteristic can be minimized by removing deposits from the surface that is in contact with the plasma. That is, by arranging the radical control material so as to enclose the plasma and then applying a voltage from outside during the etching of the sample, it was possible to automatically remove deposits adhering to the plasma contact surface. It is also noted that application of voltage during the sample etching process has improved the through-put. FIG. 5 shows the result of measurements by a step meter of a layer deposited when an arbitrary voltage was applied to an aluminum plate placed on a surface contacting a $C_4F_8$ plasma having a pressure of 1.5 mTorr and a microwave power of 200 W. The deposited film thickness depends on the density of the plasma, and deposits can be prevented from adhering to the surface by applying an appropriate voltage to the boundary surface with plasma, thus minimizing time-dependent variations in the etching characteristics.

BRIEF DESCRIPTION OF THE DRAWINGS

FIG. 3 is a graph showing changes in the densities of radicals, $CF_1$, $CF_2$ and $CF_3$, when a negative DC voltage is applied to a radical control material of carbon in the $CF_4$ gas plasma;

FIG. 7 is a diagram showing timings for applying voltages to each of three divided blocks of the radical control material;

FIG. 21 is a diagram showing an etched structure of a TiN—Al—TiN metal wiring layer.

DETAILED DESCRIPTION OF THE PREFERRED EMBODIMENTS (Embodiment 1)

Figure 1:
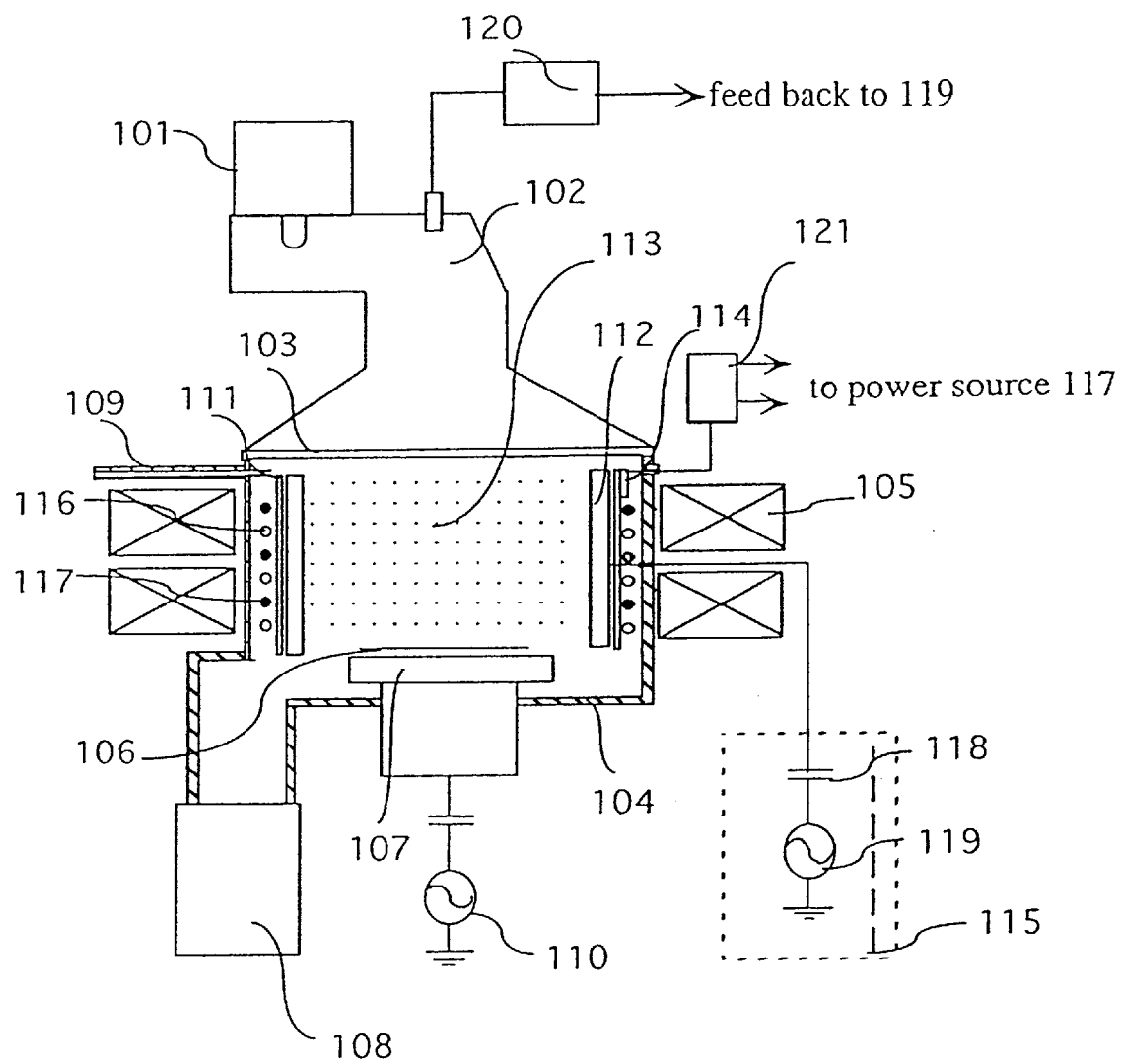
FIG. 1 is a schematic diagram showing a cross section of a plasma etching apparatus, representing a first embodiment of this invention, mounting a radical control material.
Figure 2A:
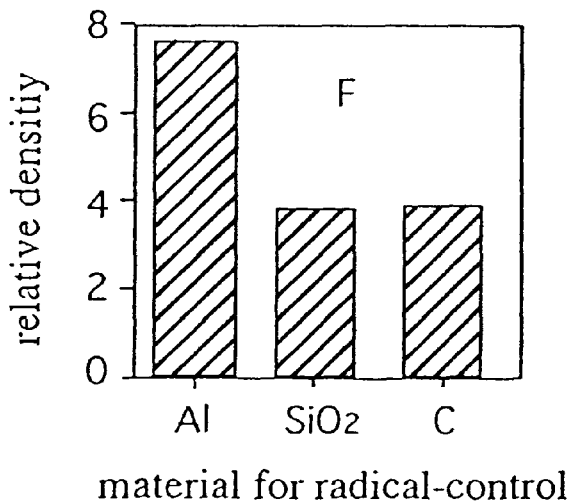
FIGS. 2(*a*) and 2(*b*) are graphs showing the densities of fluorine and $CF_2$, respectively, in a $CF_4$ plasma when Al, $SiO_2$ and C are used as the radical control materials.
Figure 2B:
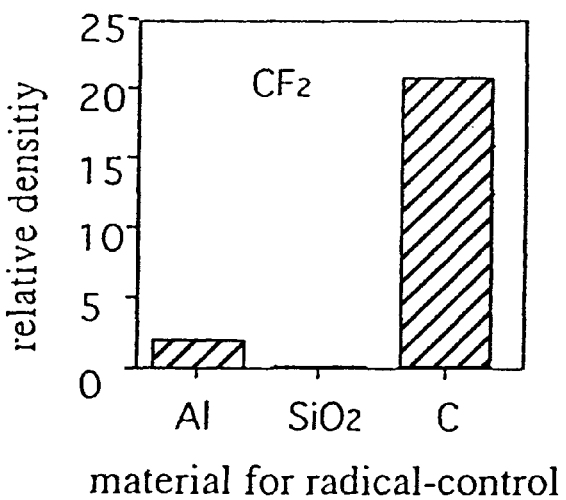

FIG. 1 is a schematic diagram of an etching apparatus according to this invention as seen from the side, and which employs an ECR plasma, one of the plasma generation systems that utilize interaction between magnetic fields and electromagnetic waves. A reaction chamber 104 includes a microwave introducing window 103, an evacuating system 108 and a gas introducing pipe 109, and there is also a sample holder 107 inside the chamber on which to place a sample 106. The plasma generation system comprises a microwave generator 101, a waveguide 102 and an electromagnet 105. The sample holder 107 is connected with an RF power supply 110 that accelerates ions incident on the sample 106. The RF power supply 110 produces radio waves at several hundred kHz to several tens of MHz, which accelerate ions that impinge on the sample 106 promoting the etching process.

A gas is introduced from the gas introducing pipe 109 into the reaction chamber 104 where a plasma 113 is generated. When performing etching on an oxide film, in particular, a fluorocarbon gas plasma is used, which contains reactive species such as fluorine, $CF_1$, $CF_2$ and $CF_3$. If there is an excess amount of fluorine in the plasma, both a nitride film and an oxide film are etched during, for example, an SAC process, which means it is difficult to perform a selective etching. Thus, to perform selective etching during the SAC process, it is necessary to reduce the amount of fluorine in the plasma. This etching equipment newly incorporates a radical control material 112 that contains materials that will control reactive species. The radical control material 112 is temperature-controlled by a heater 116, a cooling pipe 117 and a temperature control circuit 121. The temperature is monitored by a temperature monitor 114. The temperature control will be explained in Embodiment 5. In this equipment the plasma state is monitored by an optical emission spectrometer having a feedback circuit.

It has been found that applying a voltage to the radical control material 112 further promotes the above-mentioned transformation reaction. A means for applying a voltage to the radical control material 112 is constructed by inserting an insulator 111 between the radical control material 122 and the reaction chamber 104 and installing a voltage application circuit 115 consisting of a blocking capacitor 118 and an AC power supply 119. The blocking capacitor blocks a DC current from the plasma and produces a DC voltage Vdc that enables ions to be accelerated effectively. The voltage application circuit 115 may use an AC power supply 119, a pulse power supply or, if the radical control material is a conductive material, a DC source. The insulator 111 is preferably made of alumina and silicon nitride that can withstand a temperature as high as 400° C. It is of course not necessary to provide the insulator 111 if a voltage is not applied.

Figure 18:
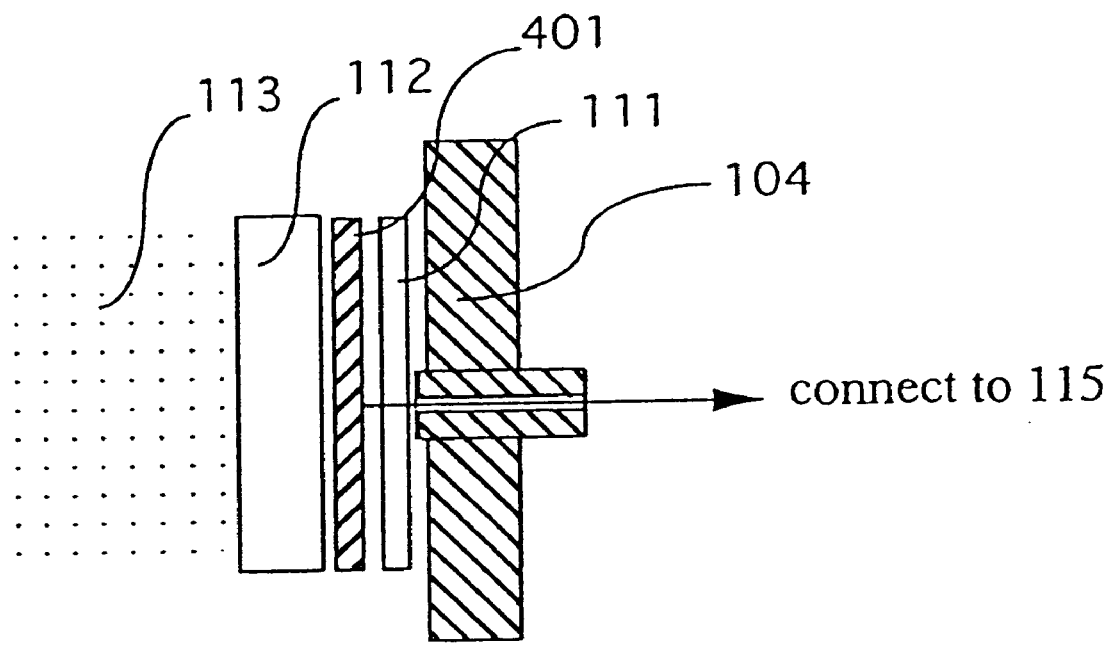
FIG. 18 is a diagram showing a conductive plate inserted between the radical control material and an insulator and connected to the voltage application circuit.

When insulators such as quartz and silicon nitride are used for the radical control material 112, a better voltage introducing efficiency is obtained if a conductive plate 401 is inserted between the radical control material 112 and the insulator 111 as shown in FIG. 18, and the conductive plate 401 is connected with the voltage application circuit 115.

FIG. 3 shows measurements of the densities of radicals $CF_1$, $CF_2$ and $CF_3$ when a negative DC voltage is applied to the radical control material 112 of carbon in the $CF_4$ gas plasma. It is found that, as the applied voltage increases, $CF_3$ decreases and $CF_2$ increases. This results from an ion-assisted reaction in which chemical reactions are accelerated by localized quasi-high temperature conditions that are generated by ions impinging on a fluorocarbon-based layer deposited over the radical control material.

Generally, chemical reaction products formed at high temperatures are known to be likely to produce molecules that are unstable at normal temperatures at which there are fewer atoms to combine. For example, chlorine atoms adsorbed onto a silicon substrate are known to produce $SiCl_2$ from a chemical reaction with the base silicon at the substrate temperature of 600° C., whereas it produces SiCl at 900° C. Hence, under the ion energy obtained in our experiments, it is assumed that $CF_2$ is likely to be produced stably. That is, by utilizing the ion-assisted reaction, which is obtained by using carbon for the radical control material 112 in the fluorocarbon gas plasma and applying a voltage to the radical control material, it is possible to transform F and $CF_3$ in the plasma into $CF_2$ and thereby control the reactive species in the plasma.

The plasma density used determines the lower limit of the frequency of an RF voltage that can be applied to the radical control material. The plasma density used for etching is around $10^{11}$–$10^{12}$ particles/cm$^3$ and the corresponding saturated ion current density $I_c$ is around $10^{-2}$–$10^{-4}$ A/cm$^2$. When an RF wave is applied to an electrode in the plasma, the frequency required is more than about $I_c/(CV)$. This relation is derived qualitatively from the fact that a voltage of the electrode that has dropped by the voltage application mechanism needs to change more rapidly than does the amount of ions flowing in that act to cancel the voltage change. Here, C is an electrostatic capacitance per unit area and is about $10^{-11}$ farad, and V is an applied voltage and is around $10^2$ volt. Thus, in the above plasma used for etching, the applicable frequency of the RF wave must be more than 100 kHz. The upper limit of the frequency, where ions can follow the voltage change and the effect of an ion-assisted reaction is produced, is found to be around 100 MHz. If a pulse power supply and a DC power supply are used for the voltage application circuit 115, it is possible to localize the energy of ions incident on the radical control material and converge the transformation reaction path, allowing efficient, selective generation of reactive species by the ion-assisted reaction. When the radical control material is an isolator, the above effect can only be obtained by a pulse voltage. When it is a conductive material, however, a DC voltage should preferably be used also in terms of equipment cost. While the frequency of pulses used varies depending on the electrostatic capacitance of the voltage application system, a general system with a capacitance of about several tens of nF is required to have more than 100 kHz.

The present invention can induce the ion-assisted reaction in a deposited layer on the radical control material 112 to transform reactive species into a desired species effective for etching or removing selected species, not only when a fluorocarbon gas plasma is used but also when a carbon-based gas is used or when an organic resist is used as a mask.
(Embodiment 2)

An embodiment for etching a silicon oxide film without using PFC or HFC gas now will be described. In the embodiment that employs the ECR type microwave-discharged plasma, as shown in FIG. 1, no electrode is disposed opposite the wafer. Because carbon cannot be used for the electrode opposing the wafer, it is theoretically difficult to perform etching with a gas not containing carbon.

In our experiment, however, SiC was selected for the radical control material 112 and a gas containing Ar and $SF_6$ but not carbon was introduced into the reaction chamber 104. The total gas flow was set at 20–300 sccm and $SF_6$ was changed in the range of 1–10 sccm. The electric discharge pressure was set at 0.1–5 Pa. The introduced gas was ionized and reacted with SiC to generate the reactive species necessary for etching.

The wafer is covered with a silicon oxide film to be etched and the mask for the etching is formed of a. photoresist, which has a fine pattern made by lithography. Formed under the silicon oxide film as underlying layers are a silicon nitride film and a silicon film.

For the condition in which the etching rate of a SiC plate is in the range of 50 nm/min to 600 nm/min, the etching rate of the oxide film ranges from 400 nm/min to 2000 nm/min and the etching rate of the resist film ranges from 500 nm/min to 80 nm/min. That is, the etching rate of the resist can be adjusted by the etching rate of the SiC wall electrode to increase the selectivity. The etching rate of the silicon film also ranges in the similar way to the resist. To etch the silicon nitride film most selectively requires increasing the etching rate of the SiC wall electrode. That is, for the SiC etching rate of 250 nm/min, the oxide film etching rate was 1000 nm/min and the silicon nitride film etching rate was 70 nm/min, and the selectivity with respect to the silicon nitride film was 14.2.

Under these conditions, the temperatures of the wall electrode and the wafer electrode were varied from –60° C. to 250° C. to investigate the effect of their temperatures on the etching. Our examination found that setting the temperature of the wafer electrode as high as possible enables selective etching of the silicon oxide film with respect to the silicon nitride film. A particularly preferred temperature was more than 0° C. At the SiC temperature of 200° C., the selectivity with respect to the silicon nitride film was 5. As for the wall electrode, reaction products easily deposit on its surface at low temperatures. As in the case of the upper electrode, the temperature was found to constitute one of the factors that determine the etching rate on the electrode surface. Hence, the temperature needs to be kept at a constant value as practically as possible. In addition, as the temperature increases, the etching rate becomes high. When the temperature is set low, the efficiency of transformation reaction of the reactive species deteriorates. Thus, in the above temperature ranges, a desired etching rate can be set. This embodiment has demonstrated that when a gas plasma not containing carbon is used, a silicon oxide film can be etched at a high etching rate by including carbon in the solid surface contacting the plasma, by causing this solid to perform an etching reaction, and by setting the temperature of the solid at specifically more than 0° C. This has verified the effectiveness of this invention.

The gas used in this embodiment that does not contain carbon is a gas mixture of Ar and $SF_6$. Other inert gases such as Ne, Kr and Xe may be used. A fluorine-containing gas, such as $SF_6$, though it has a high greenhouse effect coefficient and a long lifetime and is thus not desirable, has the advantage of requiring only a very small consumption. Effective gases other than $SF_6$ include $F_2$, HF, $XeF_2$, $PF_3$, $BF_3$, $NF_3$, $SiF_4$, and halides such as fluorine chlorides ClF and $ClF_3$, fluorine bromides BrF, $BrF_3$ and $BrF_5$ and fluorine iodide $IF_5$.

It is also found that materials that can play a similar role to that of SiC include a pyrolytic graphite plate, an organic resin film, SiCN, a diamond plate, $Al_4C_3$, and a carbon-containing material such as boron carbide. A structure having these carbides formed on the surface of other materials can similarly produce reactive species necessary for etching.
(Embodiment 3)

Figure 4A:
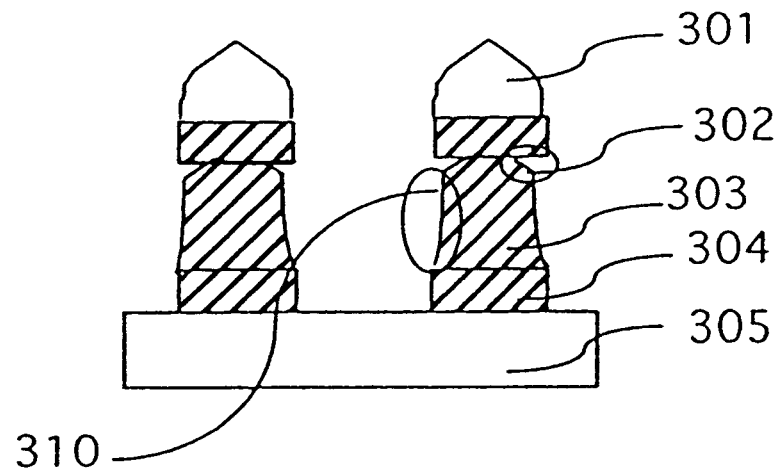
FIG. 4(a) is a diagram showing a resist-TiN—Al—TiN laminated structure etched by a conventional ECR plasma etching equipment and FIG. 4(b) is a graph which shows changes in the density of chlorine atoms present in the plasma.

An embodiment that uses for the radical control material the same material as the one to be etched will be explained. The use of such a material is particularly effective in improving abnormal deformations that would occur when etching a sample having laminated layers of different materials in the same plasma. For example, FIG. 4(a) shows a cross section of a laminated structure consisting of a resist layer 301, a TiN layer 304, an Al layer 303 and a TiN layer 304 formed over an $SiO_2$ layer 305, after being etched in a chlorine plasma by conventional ECR plasma etching equipment during a metal wiring process. As shown in the figure, the etched shape obtained with the conventional equipment has defects (notched portions) in the Al portion 302 at the boundary with the upper TiN layer 304.

Figure 4B:
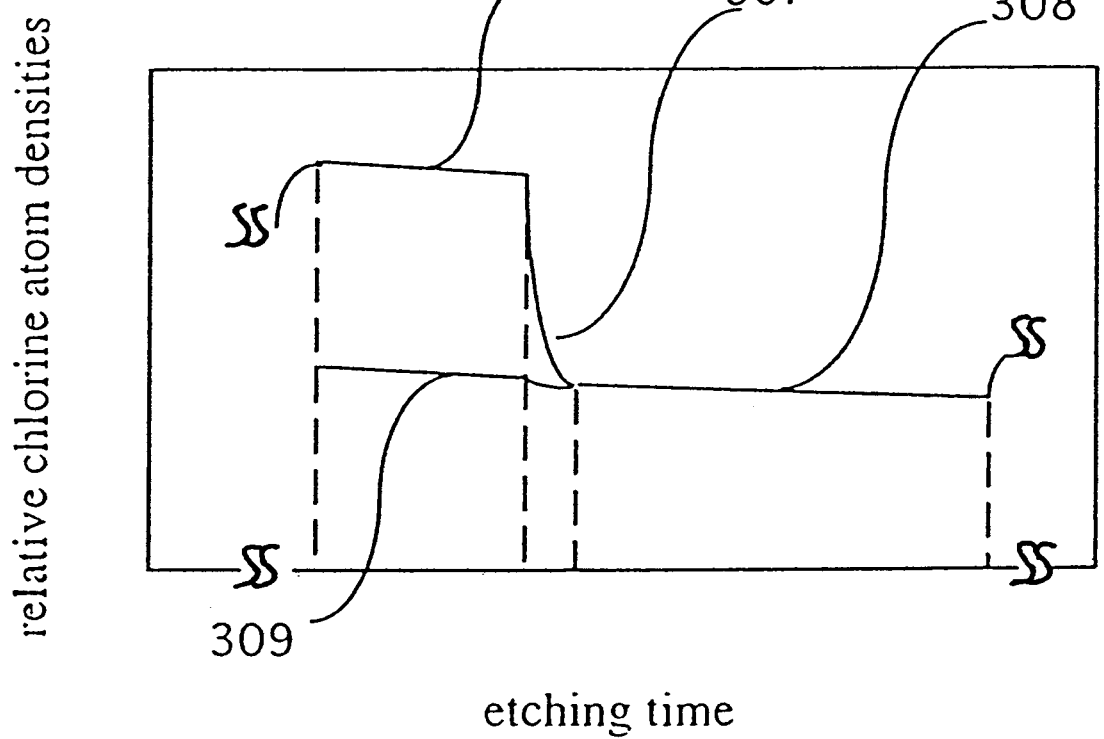

FIG. 4(b) shows variations in chlorine atom density in the plasma during etching. The graph indicates that the chlorine atom density 307 at the notched portion sharply decreases from a high chlorine atom density 306, that corresponds to the TiN etching, to a low stable density 308, which corresponds to the Al etching. This means that abnormal deformations are produced during the etching process corresponding to the notched portion 302 because of an excessively high chlorine atom density.

The use of Al for the radical control material 112 during etching can lower the chlorine atom density during the etching of the TiN 304 to the chlorine radical density 309 (FIG. 4(b)) by consuming the chlorine atoms with aluminum atoms from the wall surface. This minimizes a sharp change in the chlorine radical density when the layer being etched switches to the aluminum layer. This is shown in FIG. 21. That is, when the etching process moves from one layer to another with different consumptions of reactive species, excess reactive species may remain. This is considered the major cause for the abnormal deformations between different materials. Hence, when etching a layer with a smaller consumption of reactive species, the radical control material has a voltage applied thereto which is sufficient to consume the etchant and thereby make the amount of reactive species impinging on the sample constant. With this method, variations in the etchant density were minimized.

Because the use of radical control material which is the same material as the mask can reduce variations in the densities of oxygen and carbon in the plasma produced from the etched mask material, it is possible to form a sidewall protection film that is stable over time and to produce a desirable etched configuration with no undercut 310 (FIG. 4(a)).

This invention is also applicable to other laminated layer structures. They include, for example, a resist-polysilicon lamination structure, an $SiO_2$—$Si_3N_4$ structure, an Al—W—Al structure, a TiN—AlCu—TiN—Ti structure, a TiN—Cu—TiN structure, an $SiO_2$ mask-Pt structure, and a polysilicon-$SiO_2$ structure. For these laminated structures, it is necessary to use polysilicon, $Si_3N_4$, W, Al, Cu, Pt and $SiO_2$ for the radical control material. While the effectiveness of this invention is assured if the radical control material includes the same material as the material being etched, a similar effectiveness can be obtained if other materials are used whose rate of reaction with the etchant is similar to the etchant reaction rate of the material being etched.

In this case, the difference in the etchant density between different materials is roughly the ratio between the areas of the etched surface and the radical control material. The surface of the sample to be etched comprises a mask portion and a material portion to be etched. It is possible to minimize a change in the density of reactive species by making the area of the radical control material in contact with the plasma larger than the area of the mask portion or the material portion, whichever is smaller.
(Embodiment 4)

Figure 6:
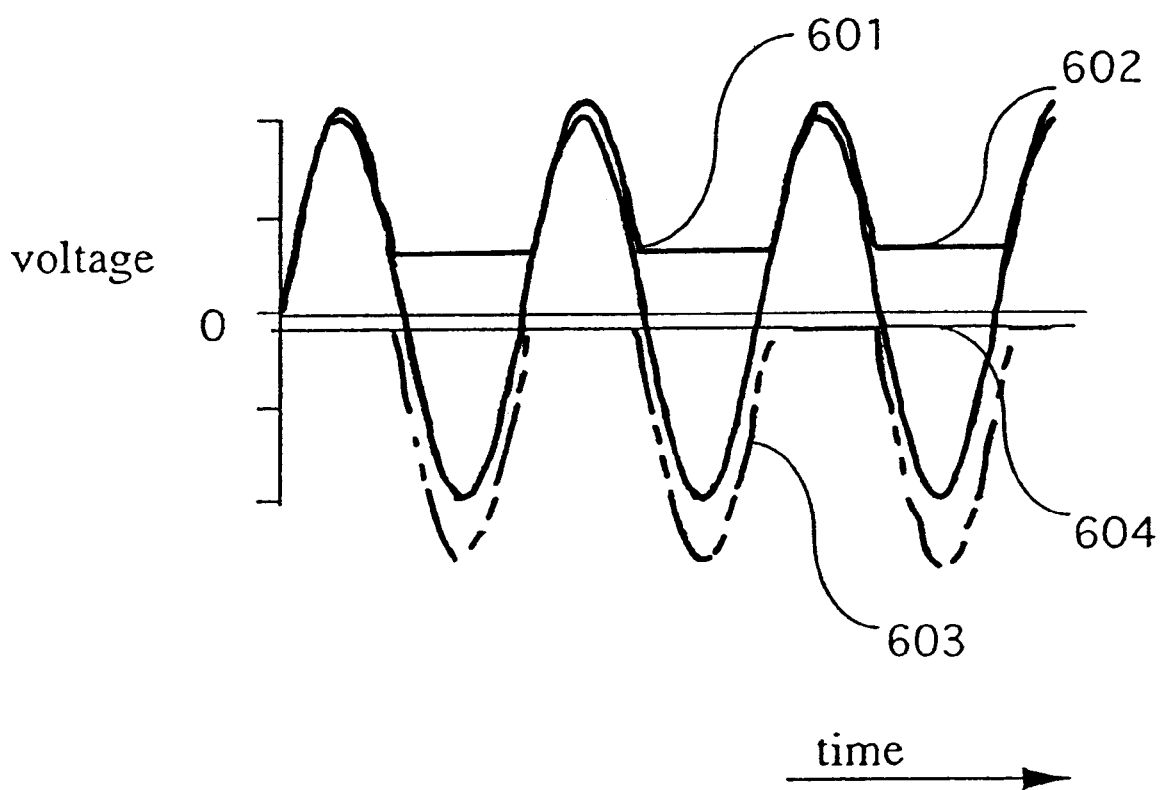
FIG. 6 is a waveform diagram showing a plasma potential, an applied voltage, a plasma sheath voltage and a self-bias voltage when an area of the radical control material is almost equal to an area of a portion that determines the plasma potential.

Another embodiment will be described which shows a method and system for applying a voltage to the radical control material. When, during the application of an RF wave to the radical control material, the area of the radical control material is almost equal to the area of a portion that determines the plasma potential, the plasma potential 602 changes following the applied voltage 601, as shown in FIG. 6. When this applied voltage, follow phenomenon of the plasma potential 602 takes place, the sheath voltage 603 between the plasma and the radical species control material becomes as shown at 603 and its DC component, a self-bias voltage 604, is no longer applied, making it impossible to control the energy of ions incident on the sample 106 and the radical control material 112 This must be avoided. For this purpose, it is effective either to make the area of the radical control material to be supplied with a voltage smaller than the area of the portion that determines the plasma potential, or to reduce the amount of ions flowing in one cycle by increasing the frequency of the applied voltage, or to increase the capacitance of the blocking capacitor 118. It is preferred that the radical control material 112 be divided into a plurality of isolated blocks. This method reduces the total amount of ion current entering from the plasma when a voltage is applied, and is thus effective in avoiding the applied voltage-follow phenomenon of the plasma potential.

Figure 8A:
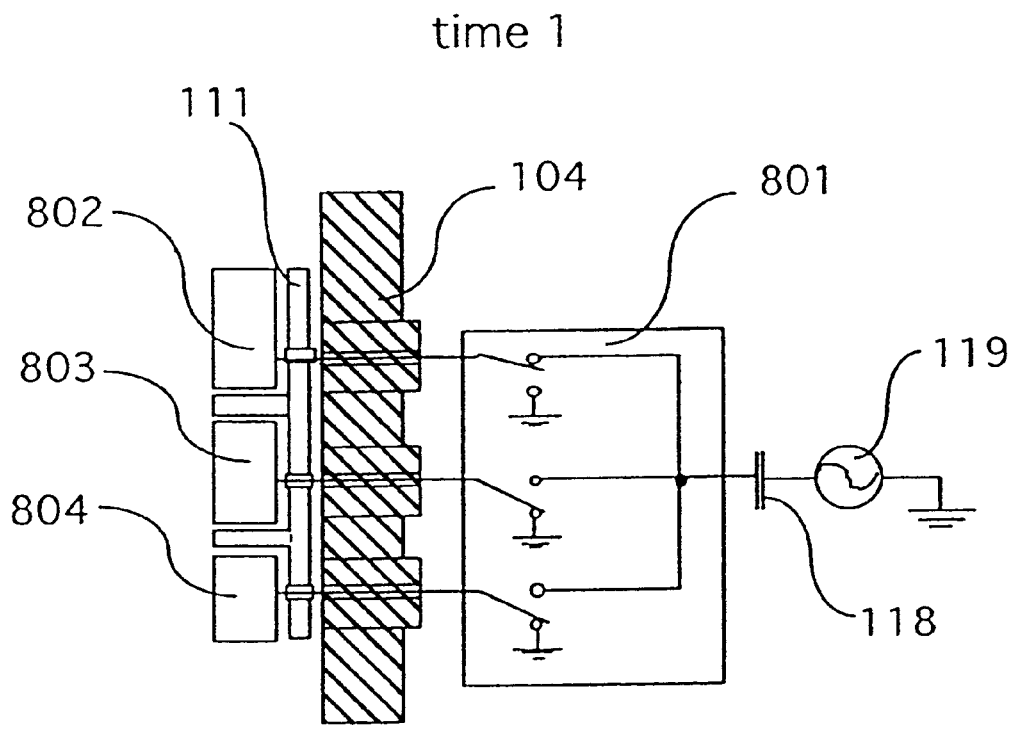
FIGS. 8(a) and 8(b) are schematic diagrams showing the operation of a voltage application circuit incorporating a relay circuit when the radical control material is divided into three blocks.
Figure 8B:
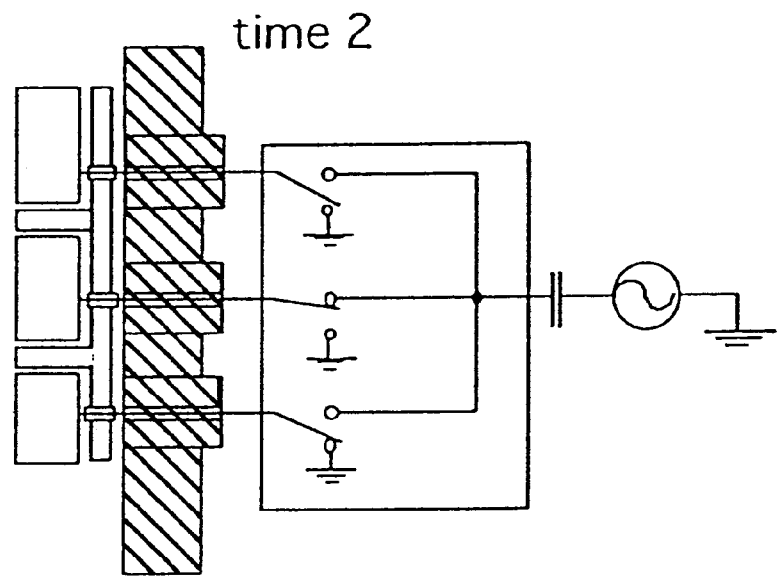

Another effective method is shown in FIG. 8(a) and FIG. 8(b), which are schematic diagrams representing the operation of the voltage application circuit, which has the radical control material divided into three blocks 802, 803, 804 isolated from one another by an isolator 111 and which incorporates a relay circuit 801. The relay circuit 801 can further reduce the area ratio between the block portion supplied with a voltage and a portion that determines the plasma potential (in this case the ground portion). A similar effect can be obtained if a plurality of radical control materials of small areas are arranged.

The operation of the relay circuit 801 when the three divided radical control materials are supplied with RF voltages at timings shown in FIG. 7 will be explained by referring to FIG. 8(a) at time 1 and FIG. 8(b) at time 2. First, at time 1, a block 802 is connected to the RF power supply 119, with other blocks grounded. Next, at time 2, a block 803 is connected to the RF power supply 119, with other blocks grounded. Likewise, at time 3, a block 804 is connected to the RF power supply 119 with other blocks grounded. In this way, by successively applying a voltage to one block at a time and grounding the remaining blocks, it is possible to effectively prevent variations of the plasma potential. Although the radical control material is divided into three blocks in this case, it only needs to be divided into two or more to attain similar effects.

Figure 9A:
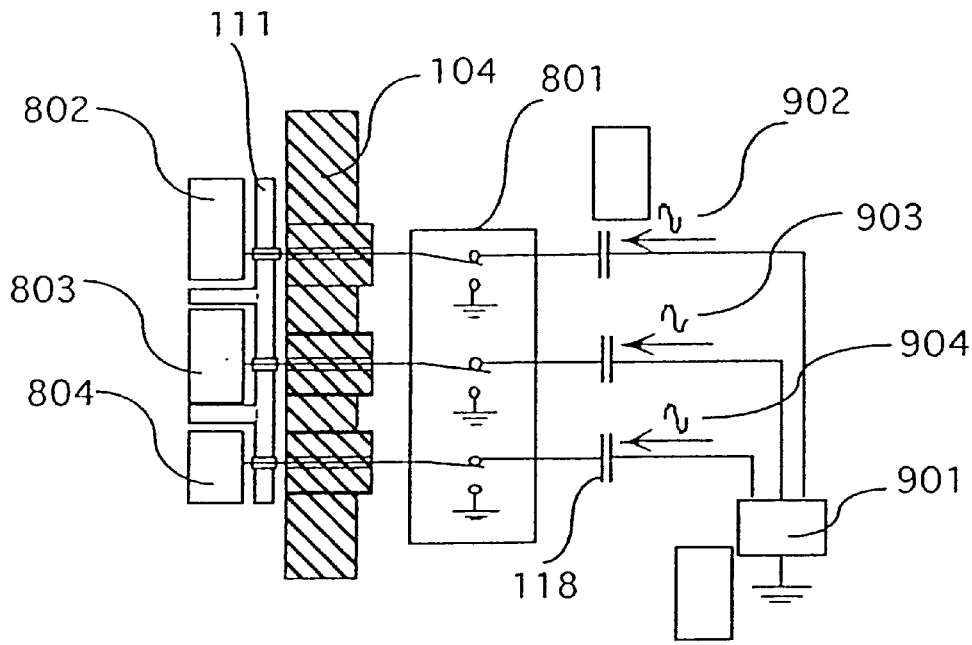
FIG. 9(a) is a schematic diagram showing the configuration of the voltage application circuit connected to a multiple phase power supply and FIG. 9(b) is a waveform diagram showing a plasma potential, applied voltages, plasma sheath voltages and a self-bias voltage.
Figure 9B:
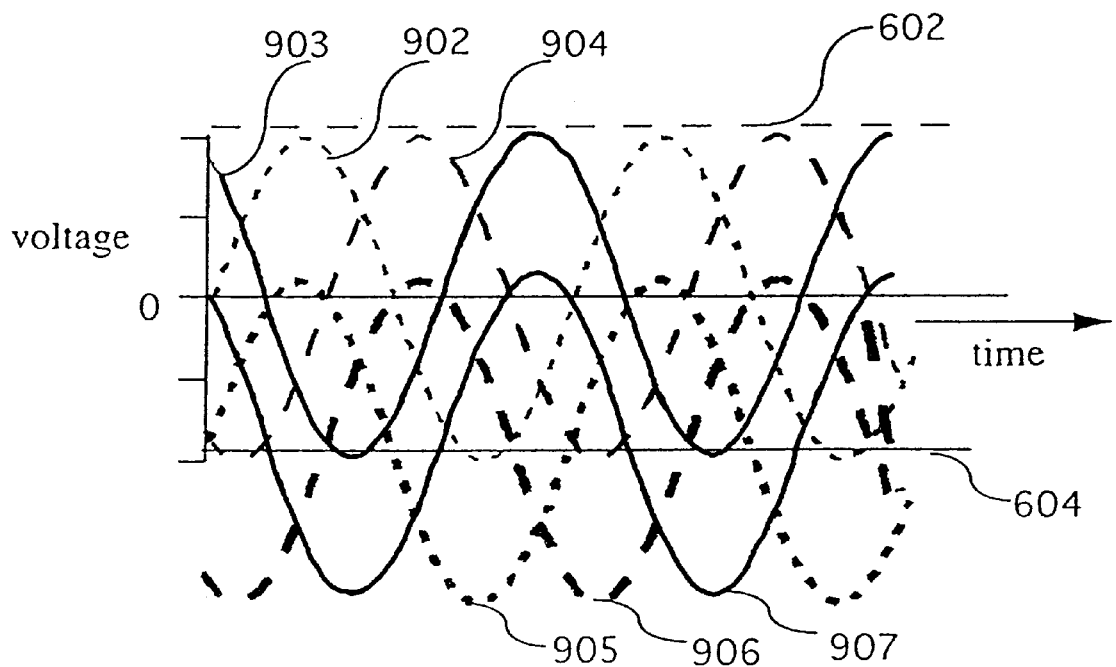

While the method of FIG. 8(a) and FIG. 8(b) can satisfy the need of only removing deposits, the efficiency of controlling reactive species is considered to deteriorate as the area of the radical control material decreases. To cope with this problem, a multiple phase RF power supply 901, instead of the RF power supply 119, is connected to the three divided blocks, i.e. block 802, block 803 and block 804, as shown in FIG. 9(a), to apply RF waves of different phases to these blocks simultaneously (the block 802 is supplied with a sine wave 902 with an initial phase of 0 degree, the block 803 is supplied with a sine wave 903 with an initial phase of 120 degrees, and the block 804 is supplied with a sine wave 904 with an initial phase of 240 degrees). This smoothes out the plasma potential 602 with respect to time, as shown in FIG. 9(b). Because voltages can be applied to a plurality of blocks at the same time, the reactive species control efficiency is improved over the method of FIG. 8(a), which in turn leads to an improved deposit removing efficiency. This method can also be implemented by using a plurality of RF poller supplies of different phases. For controlling the energy of ions incident on the radical control material, it is of course possible to produce a similar effect by applying different frequencies to the divided blocks.
(Embodiment 5)

An embodiment that has a temperature control mechanism for the radical control material will be described in the following by referring to FIG. 1. For the control of reactive species, this invention provides two methods, one that utilizes the fact that there are different stable products at different temperatures during the process of chemical reaction and one that performs macroscopic control on the temperature of the radical control material. Both methods are effective for the control of reactive species. The temperature of the radical control material 112 during the operation of the equipment is kept constant without using heat from the plasma to keep constant the amount of desorbed substances from the radical control material 112, such as oxygen, water and hydrogen, and the efficiency of chemical reaction at all times. An example of a way to keep the temperature of the radical control material constant comprises use of a heater 116 as a heating means, a cooling pipe 117 as a cooling means, a temperature monitor 114 as a temperature sensing means, and a temperature control circuit 121 that regulates the temperature of the heater 116 and the cooling pipe 117 in response to the measurement from the temperature monitor 114. The heating means may use an infrared lamp and the cooling means may use liquid nitrogen, water or oil.
(Embodiment 6)

Figure 10:
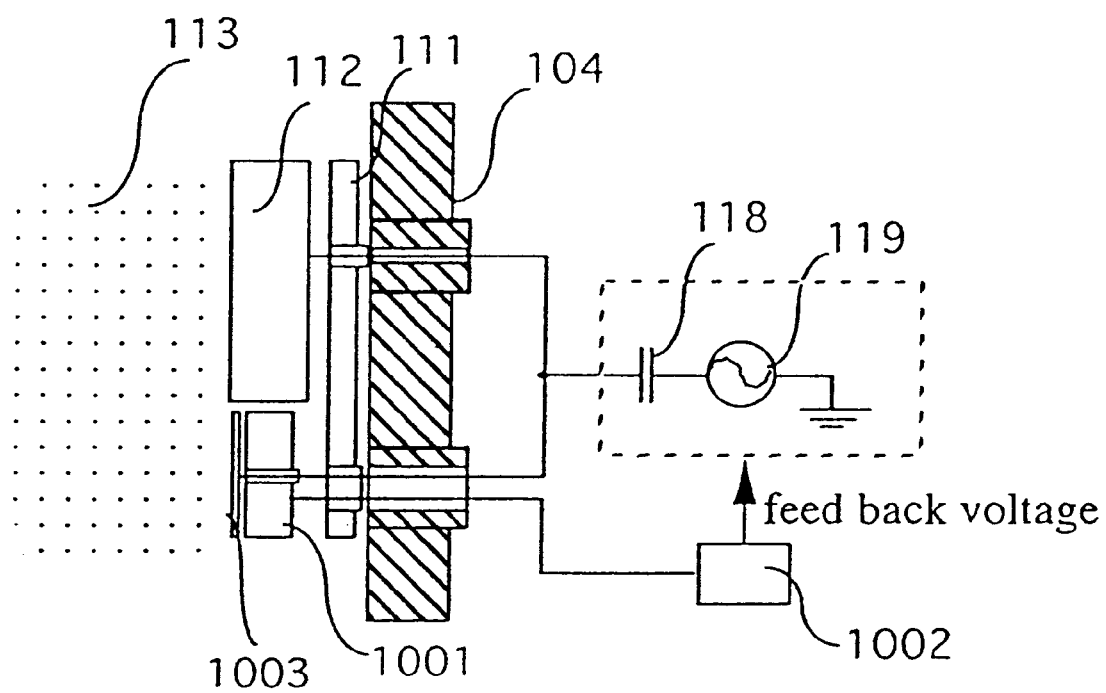
FIG. 10 is a schematic diagram of an embodiment of a means to detect the deposition rate or sputter rate on the radical control material.

An embodiment will be described which shows a system that controls the voltage and frequency to be applied to the radical control material according to the amount of reactive species in the plasma, the deposition rate on the radical control material 112, the plasma condition and the sample processing condition. As seen in FIG. 1, an insulator 111 is disposed inside a reaction chamber 104. An embodiment having a means to detect the deposition rate and sputter rate on the radical control material is shown in FIG. 10. The sputter rate detection means has a quartz oscillator probe 1001 on which there is sputtered a substance 1003 constituting the radical control material, the quartz oscillator probe 1001 being connected to the RF power supply 119 through a blocking capacitor 118, so that the substance 1003 can be supplied with the same voltage as is applied to the radical control material 112. The rate at which the particles are adhering to or removed from the radical control material during the operation of the etching equipment is measured from changes in the oscillation of the quartz, and a voltage corresponding to the oscillation changes is fed back from the feedback circuit 1002 to the voltage application circuit 115 in order to control the voltage and frequency applied to the radical control material 112 and thereby control the etching rate to an appropriate level. This prolongs the life of the radical control material 112 and also makes it possible to deal with the constantly changing plasma conditions.

A detector to detect a change in the amount of reactive species in the plasma includes an optical emission spectrometer 120, as seen in FIG. 1, and an electric circuit which, based on an increase or decrease in the amount of reactive species, controls the voltage applied to the radical control material. This detector controls the amount of reactive species in the plasma in real time and keep it constant at all times.

Figure 17:
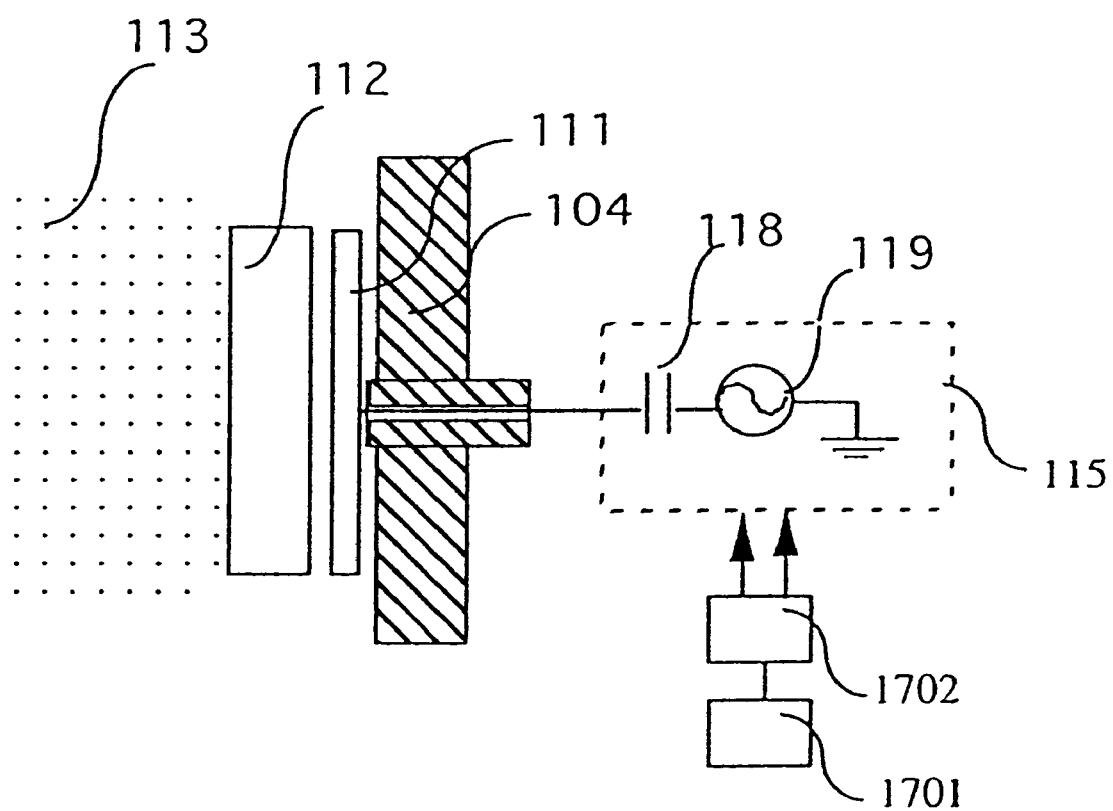
FIG. 17 is a schematic diagram showing a mechanism for controlling the magnitude and frequency of an RF voltage to be applied according to the sample process time.

FIG. 17 shows a control system for controlling an RF applied voltage and frequency according to the sample process time. For the time control, a time control computer 1701 and a control program are used. Based on the programmed time sequence, the computer changes the voltage and frequency applied to the radical control material 112 over time. Digital signals corresponding to the voltage and frequency values from the time control computer 1701 are converted by a D/A converter 1702 into analog voltages, which are then fed to the voltage application circuit 115 that changes the voltage and frequency applied to the radical control material 112. This method has fewer mechanisms to be added to the reaction chamber and allows arbitrary time control from outside the reaction chamber. That is, if the etching rate and the thickness of a film to be etched in the sample process are known, the voltage and frequency values corresponding to the process time can be freely programmed and set, and this method can be advantageously implemented at relatively low cost. For the above embodiment to be realized, the voltage application circuit 115 needs to have the ability to change the voltage and frequency to be applied to the radical control material 112 by, for example, an input voltage from outside.
(Embodiment 7)

An embodiment that sets the DC component (self-bias voltage) applied to the radical control material to −20 V or less will be described. To accelerate positively charged ions requires the use of at least a negative bias, i.e., a voltage lower than 0 V. It is assumed that the area of chemical reaction based on the ion-assisted reaction is almost proportional to the range of incident ions. For example, the range R (Å) of Ar ion having the energy R (eV) of less than 1000 eV is known to have the following relation:

$$R = 0.08 \times E$$

In this case, it is necessary that there is at least one molecule in the reaction region that participates in the reaction. Because quartz with a short interatomic distance among the possible reaction species producing materials has an Si—O bond of 1.62 Å, the reaction species transformation requires an ion energy of at least 20 eV. Thus, by setting the voltage applied to the radical control material to less than −20 V, the reactive species control can be performed efficiently.
(Embodiment 8)

Figure 5:
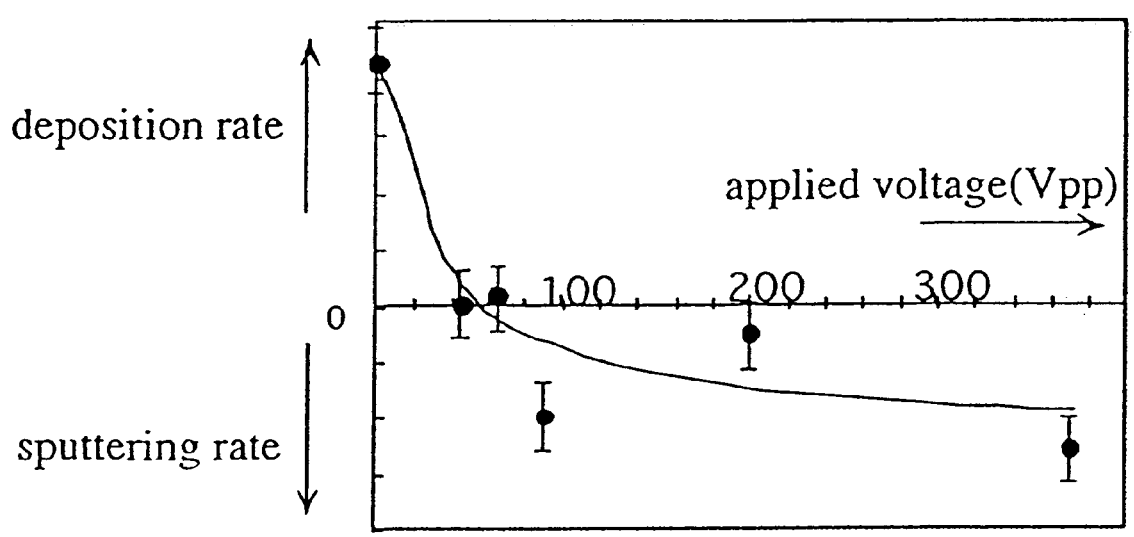
FIG. 5 is a diagram showing the thickness of a deposited layer when a voltage is applied to an aluminum plate placed on a surface contacting the $C_4F_8$ plasma.

An embodiment which sets the DC component (self-bias voltage) applied to the radical control material to −50 V or higher will be explained. FIG. 5 shows a measurement taken by a step meter of the thickness of a deposited film over an aluminum sample placed in a $C_4E_8$, gas plasma generated by an ECR plasma system that operates at 800 kHz. The measurement shows that for the condition of 1.5 mTorr and microwave power of 200 W, setting the self-bias voltage, which is a DC component of the sheath voltage, to −45 V results in the surface with no deposits and with its ground aluminum layer remaining not etched. The result of measurement suggests that, considering the surface roughness errors of the aluminum sample used for the measurement, the condition under which the radical control material is not etched can be produced by setting the applied voltage to more than −50 V. Because these voltages change depending on the unique sputter threshold voltage for the adhering reactive species, the amount of species incident on the radical control material and the plasma density, they may be adjusted by the above sputter rate detection means.

Therefore, there is an applied voltage between 0 V and −50 V that permits sputtering of only the carbon-based deposits. By applying this voltage during the sample processing, not only can the reactive species control be performed, but also deposits on the plasma boundary surface can be removed, which in turn shortens or eliminates the oxygen cleaning, improving the total throughput. In this case, the sample processing and the voltage application to the radical control material may be performed at different timings. The plasma boundary surface can also be cleaned in a similar manner by introducing a cleaning gas (oxygen, argon, etc.) in the above equipment.

(Embodiment 9)

Figure 11:
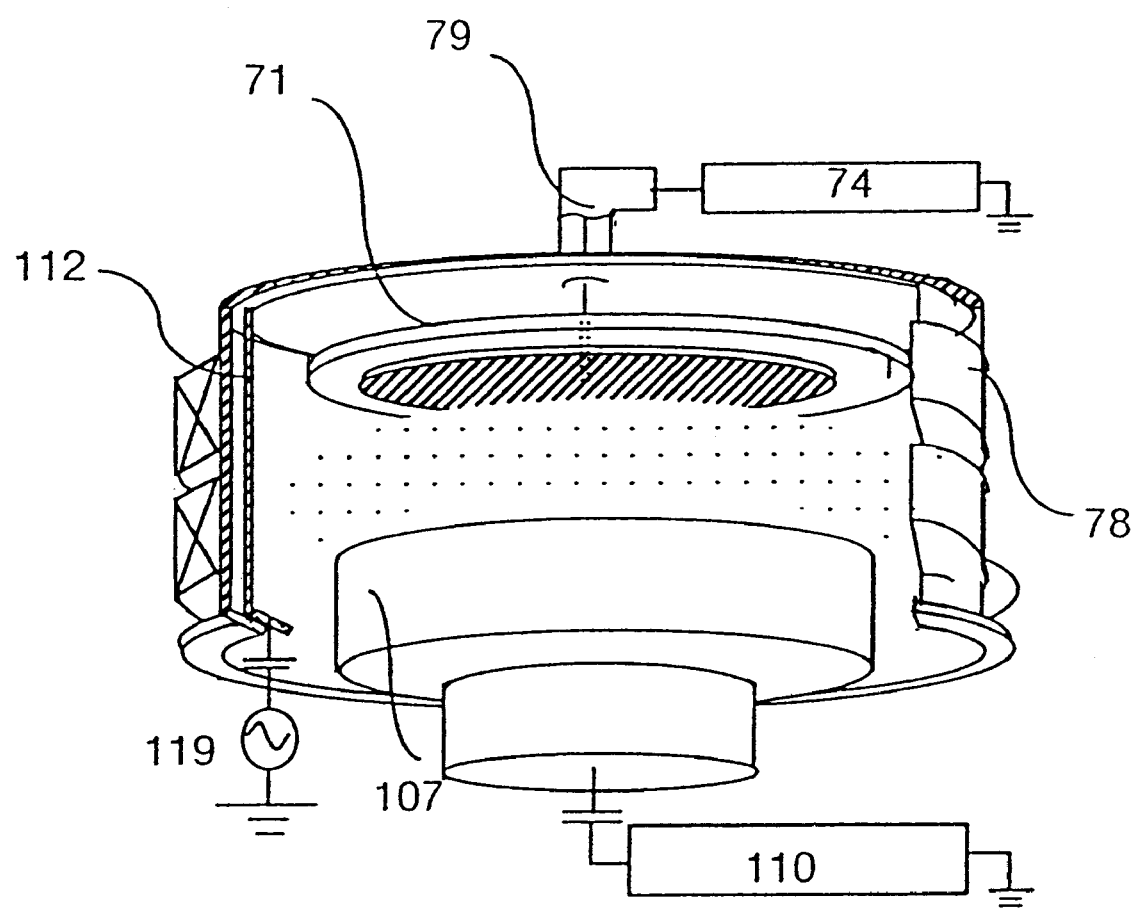
FIG. 11 is a schematic diagram showing an ECR type UHF wave plasma etching equipment using a gas composition and a radical control material of this invention.

Effective use of a gas according to this invention will be explained by referring to FIG. 11 in an example of etching a silicon oxide film in UHF wave plasma etching equipment using a magnetic field. This embodiment uses $ClF_3$ as a gas not containing carbon. The inert gas used is a mixture of Ne, Ar, Kr and Xe. Fluorine-containing gases, such as $SF_6$ and $NF_3$, though they have a high greenhouse effect coefficient and a long lifetime and are thus not desirable, have the advantage of requiring only a very small consumption. $ClF_3$ has a similar advantage.

In this embodiment, a UHF wave radiation antenna 71 is disposed opposite the wafer and is formed of a pyrolytic graphite plate. It is found that the pyrolytic graphite plate needs only to be made of a carbon-containing material, such as SiC, an organic resin film, SiCN, a diamond plate, $Al_4C_3$, and a boron carbide. A similar effect is also obtained if these carbides are formed on a surface. A low-path filter and an RF power supply are installed outside the UHF wave radiation antenna 71 to form an opposing electrode structure in which generated particles impinge on the sample efficiently, enhancing the effectiveness of the reactive species control.

The total gas flow was set at 50–500 sccm and $SF_6$ was changed at the rate of 1–10 sccm. The pressure for electric discharge was set at 0.5–5 Pa. A UHF wave is transmitted from a plasma discharge UHF wave source 74 through a coaxial cable 79 and is emitted from the radiation antenna 71 to produce a plasma. A bottom wafer electrode 107 is supplied with an RF power 110 that accelerates ions in the plasma. The distance between the upper and lower electrodes was set at 10–200 mm and a mechanism was provided for applying the RF power 119 to the pyrolytic graphite plate, the radical control material 112. Denoted at 78 is a magnet. The wall uses surface-treated SiC as a carbon-containing material. Applying power to SiC causes the SiC to be etched by the plasma.

The wafer is similarly formed with a silicon oxide film as a film to be etched. The etching mask was formed of a photoresist, which was finely patterned by lithography. The underlying layer for the oxide film used a silicon nitride film and a silicon film.

When the oxide film is etched under the condition that the etching rate for the pyrolytic graphite plate of the upper electrode is 50 nm/min to 600 nm/min, the etching rate for the oxide film varied from 400 nm/min to 1400 nm/min and the etching rate of the resist film varied from 600 nm/min to 60 nm/min. This means that the etching rate of the resist can be adjusted by the etching rate of the SiC wall electrode to increase the selectivity. The etching rate for the silicon film also varied in the same way as the resist. To etch the silicon nitride film most selectively requires increasing the etching rate for the SiC wall electrode.

Under this condition, the temperatures of the upper and lower electrodes and the wall electrode were changed from −60° C. to 250° C. to investigate the effect the temperature has on the etching. It was found that selective etching of the silicon oxide film with respect to the silicon nitride film can be assured by setting the wafer electrode temperature as high as possible. A particularly preferred temperature was more than 0° C. The temperature of the upper electrode was one of the factors that determine the etching rate of the electrode surface. Hence, the temperature must be kept as constant as practically possible. Further, as the temperature increases, the etching rate becomes high. Setting the temperature low reduces the efficiency of transformation reaction by the upper electrode of the reactive species. Thus, in the above temperature ranges, a desired etching rate can be set. As for the wall electrode, reaction products easily deposit on its surface at low temperatures. As in the case of the upper electrode, the temperature was found to constitute one of the factors that determine the etching rate on the electrode surface. Hence, the temperature needs to be kept as constant as practically possible. It is also found that the higher the temperature, the faster the etching rate and that setting the temperature low reduces the efficiency of transformation reaction by the upper electrode of the reactive species. Thus, in the above temperature ranges, a desired etching rate can be set. This embodiment has thus demonstrated that when C1F3 is used as a gas not containing carbon, this invention can etch a silicon oxide film at a high etching rate by including carbon in a solid surface contacting the plasma, by causing this solid to perform etching reaction, and by controlling the temperature of the solid in a range of −60° C. to 250° C. This has verified the effectiveness of this invention.

(Embodiment 10)

Figure 14:
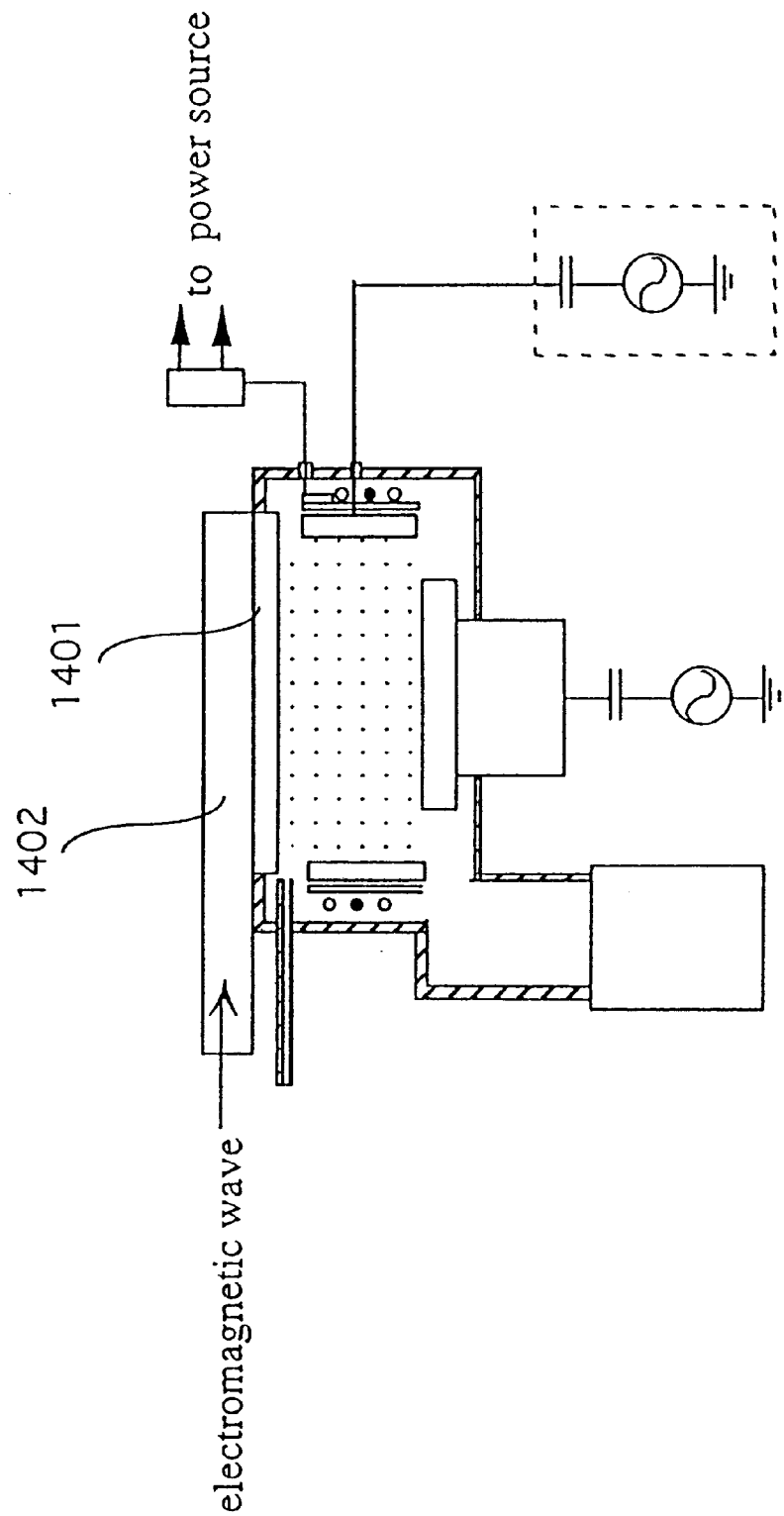
FIG. 14 is a cross section of an etching apparatus according to this invention which applies a surface wave plasma to the plasma generation system.

FIG. 14 shows an embodiment of this invention that employs a surface wave plasma as a plasma generation system. Electromagnetic waves from a waveguide 1402 impart a plasma energy through a dielectric 1401 to produce a plasma. Other elements and effects are similar to those of the ECR type plasma generation system.

(Embodiment 11)

An embodiment that uses carbon as the radical control material in performing the SAC process will be explained. FIG. 16(*a*) shows a structure of a sample before being subjected to the SAC process. A gate electrode 1504 of polysilicon is formed over a silicon substrate 1505. The SAC process is an oxide film processing that forms contact holes by etching the oxide film 1502 with the nitride film 1503 as a stopper layer, and is a favorable method when forming contact holes in DRAMs of 256 M or larger. Denoted at 1501 is a resist. When a conventional method that has no reactive species control concept or in which the reactive species control system cannot be controlled independently, for example, high-density plasma etching equipment, is used to perform etching under the condition of $C_4F_8$ 5 mTorr and a microwave power of 1100 W, a variety of problems are encountered. For example, the shoulder portion of the nitride film is eroded as shown at 1506 in FIG. 16(*b*), failing to keep the polysilicon gate 1504 isolated, or etching is stopped halfway at the bottom of the contact hole as shown at 1507 in FIG. 16(*c*). In this way the process window for desirable selective etching is narrow.

With this invention, it is possible to make the composition of a deposited film, essential for the etching reaction of an oxide film, suitable for selective etching. That is, fluorine that etches both the oxide film and the nitride film in the plasma is reduced in density and converted into $CF_2$ that is suited for selective etching. On the nitride film, this allows the deposits to remain minimizing the shoulder erosion and, on the oxide film, promotes a satisfactory surface reaction that allows etching to proceed smoothly. Hence, performing the SAC process using the method of this invention ensures a satisfactory etching geometry as shown in FIG. 16(*d*).

(Embodiment 12)

Figure 20:
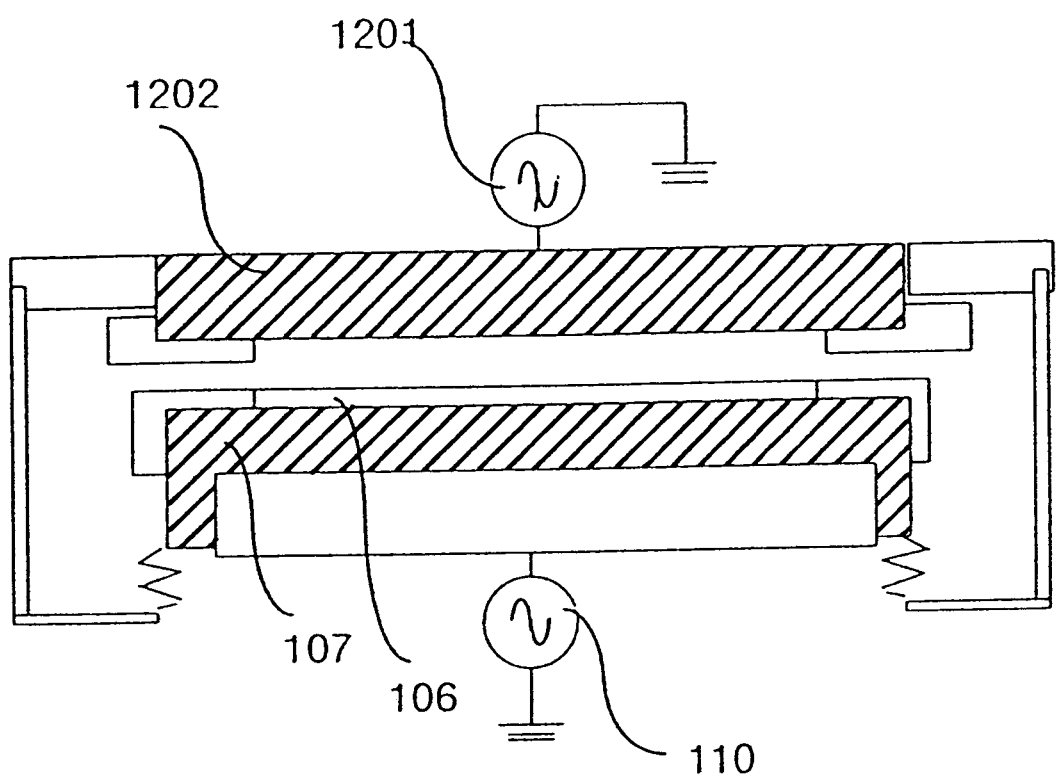
FIG. 20 is a cross section of an etching apparatus according to this invention which applies a parallel plate plasma to the plasma generation system.

An embodiment that etches a silicon oxide film in a parallel flat plate type etching apparatus by introducing a gas not containing carbon in the compounds will be explained by referring to FIG. 20. In this embodiment an electrode 1202 opposing the wafer 106 is made from a pyrolytic graphite plate. The discharge gas not containing carbon was a mixture of Ar and $SF_6$. The gas mixture was supplied from the top of the chamber through a gas introducing hole in the pyrolytic graphite plate. The total gas flow was set at 100–500 sccm and $SF_6$ was changed in the range of 1–10 sccm. The discharge pressure was set at 1–5 Pa. The upper electrode was supplied with an RF power 1201 to produce a plasma. The bottom electrode 107 was supplied by an RF power 110 to accelerate ions in the plasma. The distance between the upper and bottom electrodes was varied in the range of 5–50 mm.

The wafer used has formed thereon a resist film, a silicon oxide film, a silicon film and a silicon nitride film. Here, the silicon oxide film was etched with a photoresist as a mask.

When the etching rate of the pyrolytic graphite plate of the upper electrode was changed from 100 nm/min to 1000 nm/min, the etching rate of the oxide film changed from 500 nm/min to 2000 nm/min and the etching rate of the resist film changed from 800 nm/min to 90 nm/min. The etching rate of the resist was able to be adjusted by the etching rate of the pyrolytic graphite plate to keep the selectivity high. The etching rate of the silicon film changed in a similar manner to the etching rate of the resist. This suggests that to etch the silicon oxide film most selectively requires setting the etching rate of the pyrolytic graphite plate to 100 nm/min or higher. This embodiment has demonstrated that the silicon oxide film can be etched at a high etching rate with a gas not containing carbon, verifying the effectiveness of this invention.

(Embodiment 13)

Figure 12:
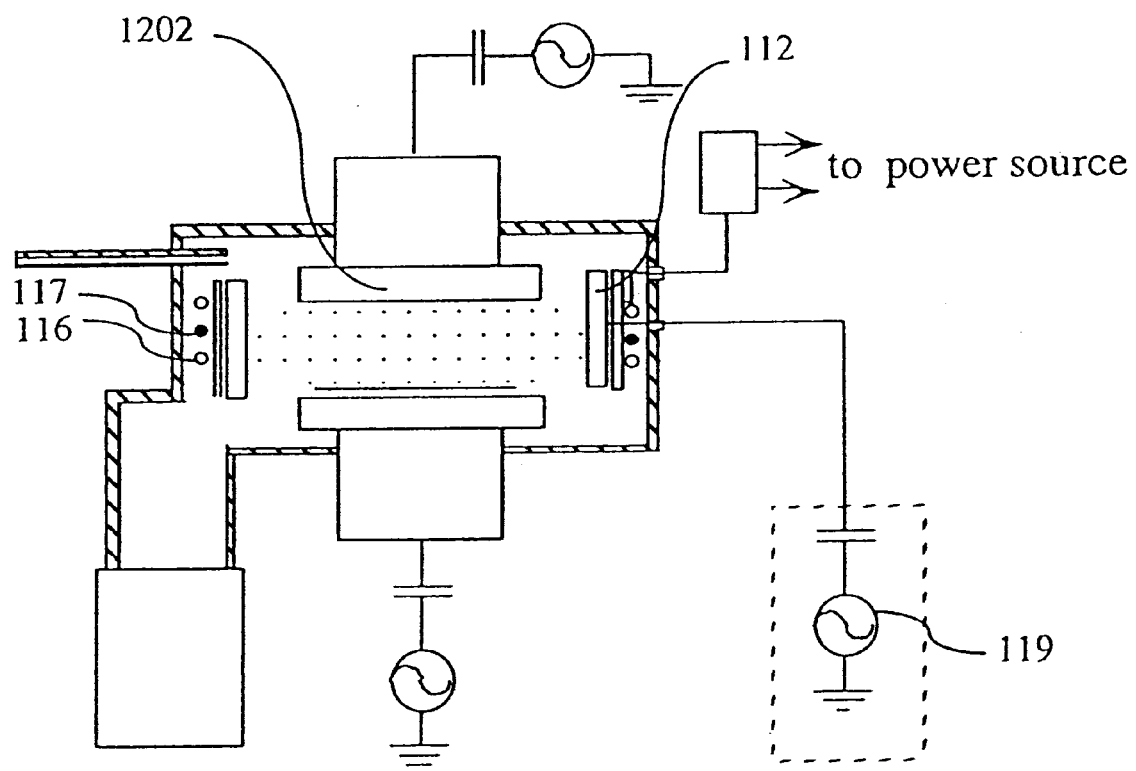
FIG. 12 is a cross section of an etching apparatus according to this invention which applies a capacitive coupled plasma to the plasma generation system.

This embodiment performs etching by using a parallel plate type plasma etching apparatus, like the one in the Embodiment 12, with a third electrode 112 arranged close to the wall surface of the plasma chamber. This embodiment will be explained by referring to FIG. 12. The third electrode uses a surface-treated SiC 112, which is supplied by a power 119 to etch the SiC with a plasma. The SiC 112 is temperature-regulated by a heater 116 and a cooling pipe 117. Other elements are similar to those of the Embodiment 12.

With the etching rate of the pyrolytic graphite plate of the upper electrode 1202 varied from 100 nm/min to 400 nm/min, the SiC 112 wall supplied by the power 119 to measure changes in the etching rate of the resist, silicon oxide film, silicon film and silicon nitride film on the wafer according to the etching rate of the SiC wall electrode. It was found that as the etching rate of the SiC electrode increased. the etching rate of the oxide film changed from 500 nm/min to 1500 nm/min and the etching rate of the resist film changed from 300 nm/min to 60 nm/min. In other words, the etching rate of the resist was able to be adjusted by the etching rate of the SiC wall electrode to keep the selectivity high. The etching rate of the silicon film also changed in the similar manner to that of the resist. It is also found that to realize the most selective etching of the silicon nitride film requires increasing the etching rate of the SiC wall electrode. This embodiment has demonstrated that the silicon oxide film can be etched at a high etching rate with a plasma of gas not containing carbon by including carbon in the solid surface in contact with the plasma and by causing an etching reaction on the solid. The effectiveness of this invention is therefore verified.

For applying power to the wall of the plasma chamber, there are some effective means. Among them is a method that divides the wall electrode into a few blocks and applies different bias powers to them. A second method is to share the bias power source of the wafer with the wall electrode by setting two powers in different phases. The second method also has proved effective.

Even when the distance between the upper and bottom electrodes is as small as 30 mm or less, the bias application to the wall electrode proved effective.

To control the etching rate of the wall electrode with high precision, the waveform and frequency of the bias power applied to the wall electrode must also be controlled. With this precise control, it is possible to make precise, uniform setting of the ion energy distribution for desired etching.

(Embodiment 14)

Figure 19:
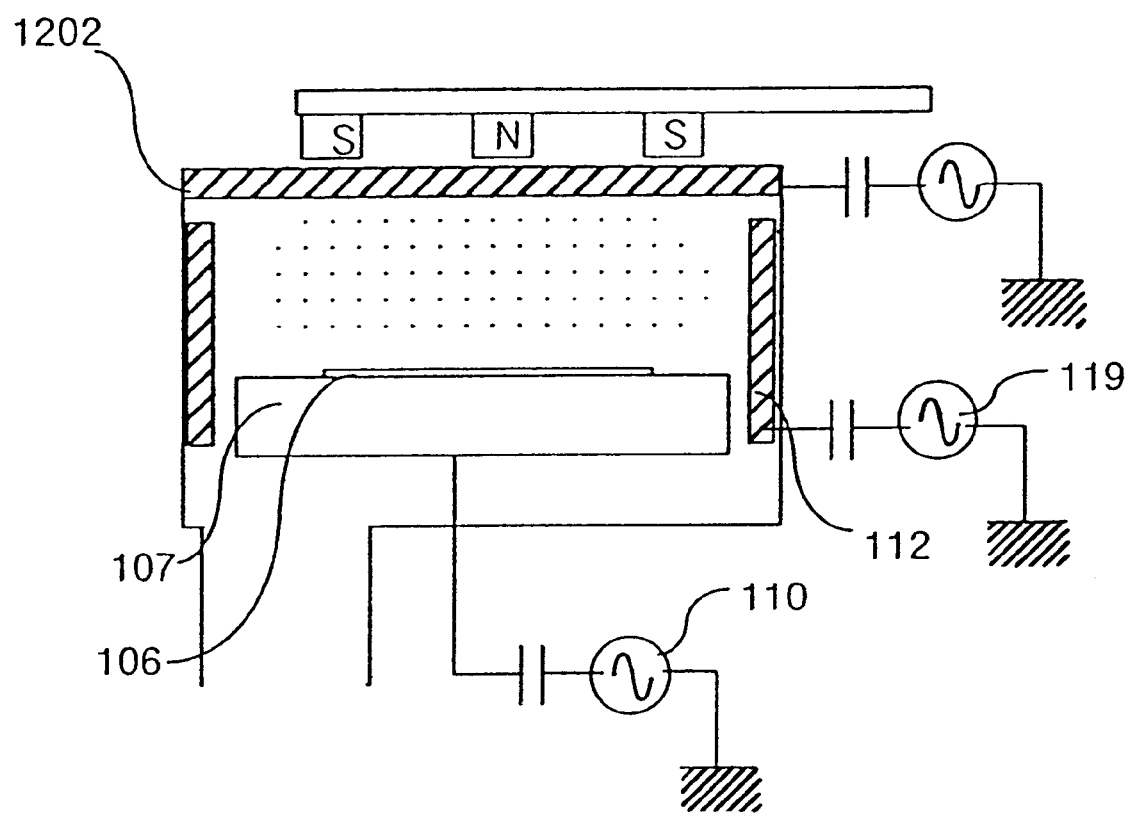
FIG. 19 is a cross section of an etching apparatus according to this invention which applies a magnetron RIE plasma to the plasma generation system.

The silicon oxide film etching in a parallel plate type etching apparatus using a magnetic field, or magnetron RIE equipment, will be explained by referring to FIG. 19. In this embodiment, the electrode 1202 opposite the wafer 106 was a pyrolytic graphite plate. The discharge gas was a gas mixture of Ar and $SF_6$. This gas mixture was supplied from the top of the chamber through a gas introducing opening in the pyrolytic graphite plate. The total gas flow was set at 20–500 sccm and $SF_6$ was varied in the range of 1–10 sccm. The discharge pressure was set at 0.1–5 Pa. The distance between the upper and bottom electrodes was set at 10–200 mm. A surface-treated SiC 112 was installed close to the wall surface. Applying power to the SiC causes the SiC to be etched with the plasma. Other elements are similar to those of the Embodiment 12.

With the etching rate of the pyrolytic graphite plate of the upper electrode being varied from 50 nm/min to 600 nm/min, power was applied to the SiC electrode to measure changes in the etching rates of the resist, silicon oxide film, silicon film and silicon nitride film on the wafer according to the etching rate of the SiC electrode. From the measurements it was found that as the etching rate of the SiC wall electrode increases, the etching rate of the oxide film changes from 400 nm/min to 1600 nm/min and the etching rate of the resist film changes from 500 nm/min to 60 nm/min. In other words, the etching rate of the resist was able to be adjusted by the etching rate of the SiC wall electrode to maintain a high level of selectivity. The etching rate of the silicon film also changed in the similar manner to that of the resist. It was also found that to realize the most selective etching of the silicon nitride film requires increasing the etching rate of the SiC wall electrode. This embodiment has demonstrated that the silicon oxide film can be etched at a high etching rate with a plasma of gas not containing carbon by including carbon in the solid surface in contact with the plasma and by causing an etching reaction on the solid. The effectiveness of this invention is therefore verified.

For applying power to the wall of the plasma chamber, there are various effective means, such as explained in the Embodiment 2. Among them is a method that divides the wall electrode into a few blocks and applies different bias powers to them. A second method is to share the bias power source of the wafer with the wall electrode by setting two powers in different phases. The second method also proved effective. Even when the distance between the upper and bottom electrodes is as small as 30 mm or less, the bias application to the wall electrode proved effective. These methods were particularly effective for the electrode distance of more than 30 mm.

(Embodiment 15)

Figure 15:
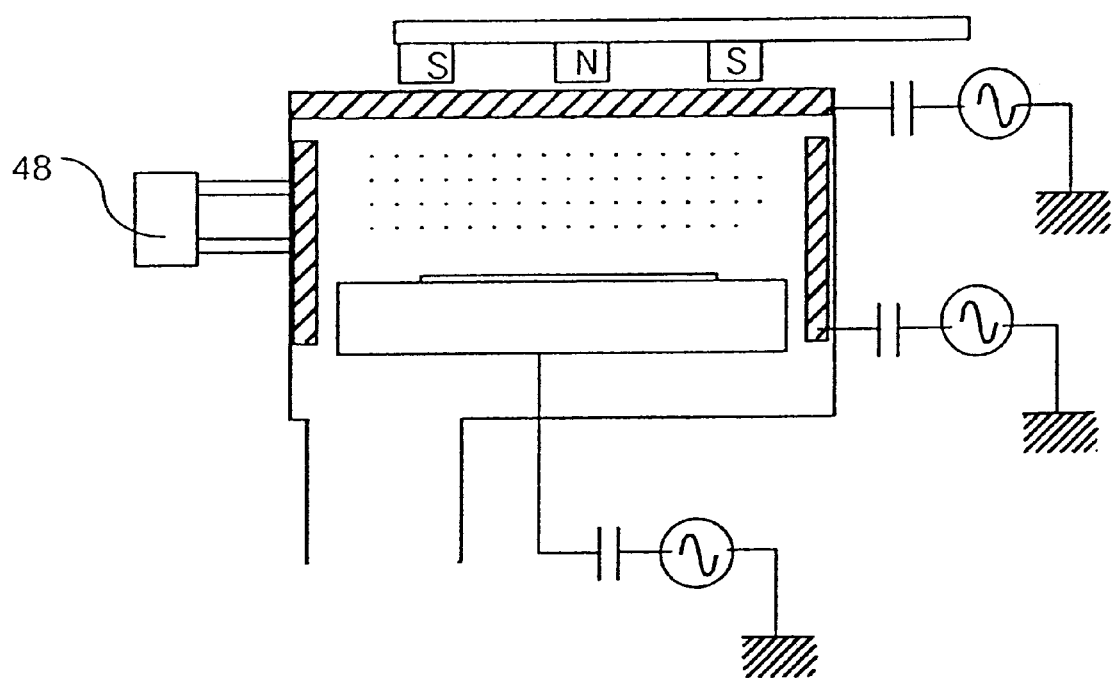
FIG. 15 is a cross section of an etching apparatus according to this invention which applies a magnetron RIE plasma to the plasma generation system.
Figure 16A:
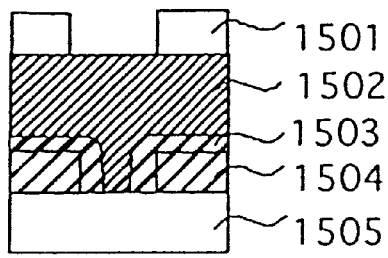
FIG. 16(a) is a diagram showing a structure of a sample before the SAC (self-aligned contact) forming process by the oxide film etching is performed.
Figure 16B:
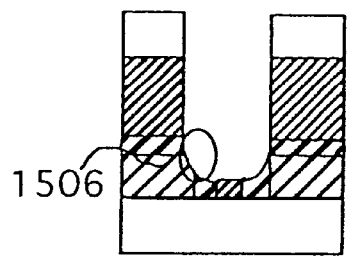
FIG. 16(b) is a diagram showing a shoulder-etched condition resulting from a conventional SAC process.
Figure 16C:
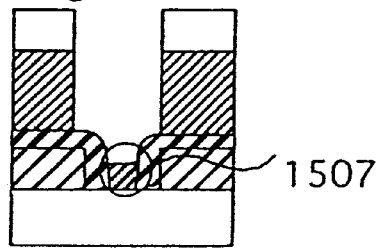
FIG. 16(c) is a diagram showing an etch stop condition during a conventional SAC process.
Figure 16D:
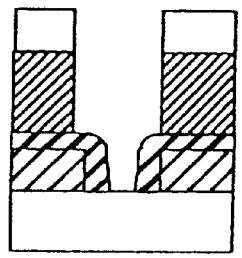
FIG. 16(d) is a diagram showing an etched shape when an SAC process according to this invention is performed.

This embodiment has a temperature adjusting system 48 added to the Embodiment 14 and performs etching by controlling the temperature of the electrodes. This embodiment will be explained by referring to FIG. 15.

The temperatures of the upper and lower electrodes and the wall electrode were varied from −60° C. to 250° C. to examine the effect the electrode temperatures have on the etching performance. The result of measurement shows that selective etching on the silicon oxide film with respect to the silicon nitride film can be achieved by setting the wafer electrode temperature as high as possible. A particularly desirable temperature was found to be 0° C. or higher. The temperature of the upper electrode was found to be one of the factors that determine the etching rate on the electrode surface. Hence, it is necessary to keep the electrode temperature as constant as possible. In addition, it was found that the higher the temperature, the faster the etching rate and that setting the temperature low degrades the efficiency of the transformation reaction by the upper electrode of the reactive species. Thus, in the above temperature range, a desired etching rate can be set.

As for the wall electrode, reaction products easily deposit on its surface at low temperatures. As in the case of the upper electrode, the temperature was found to constitute one of the factors that determine the etching rate on the electrode surface. Hence, the temperature needs to be kept as constant as practically possible. It is also found that the higher the temperature, the faster the etching rate and that setting the temperature low reduces the efficiency of transformation reaction by the upper electrode of the reactive species. Thus, in the above temperature ranges, a desired etching rate can be set. This embodiment has thus demonstrated that when a gas plasma not containing carbon is used, this invention can etch a silicon oxide film at a high etching rate by including carbon in a solid surface in contact with the plasma, by causing this solid to perform an etching reaction, and by controlling the temperature of the solid in a range of −60° C. to 250° C.

(Embodiment 16)

Figure 13:
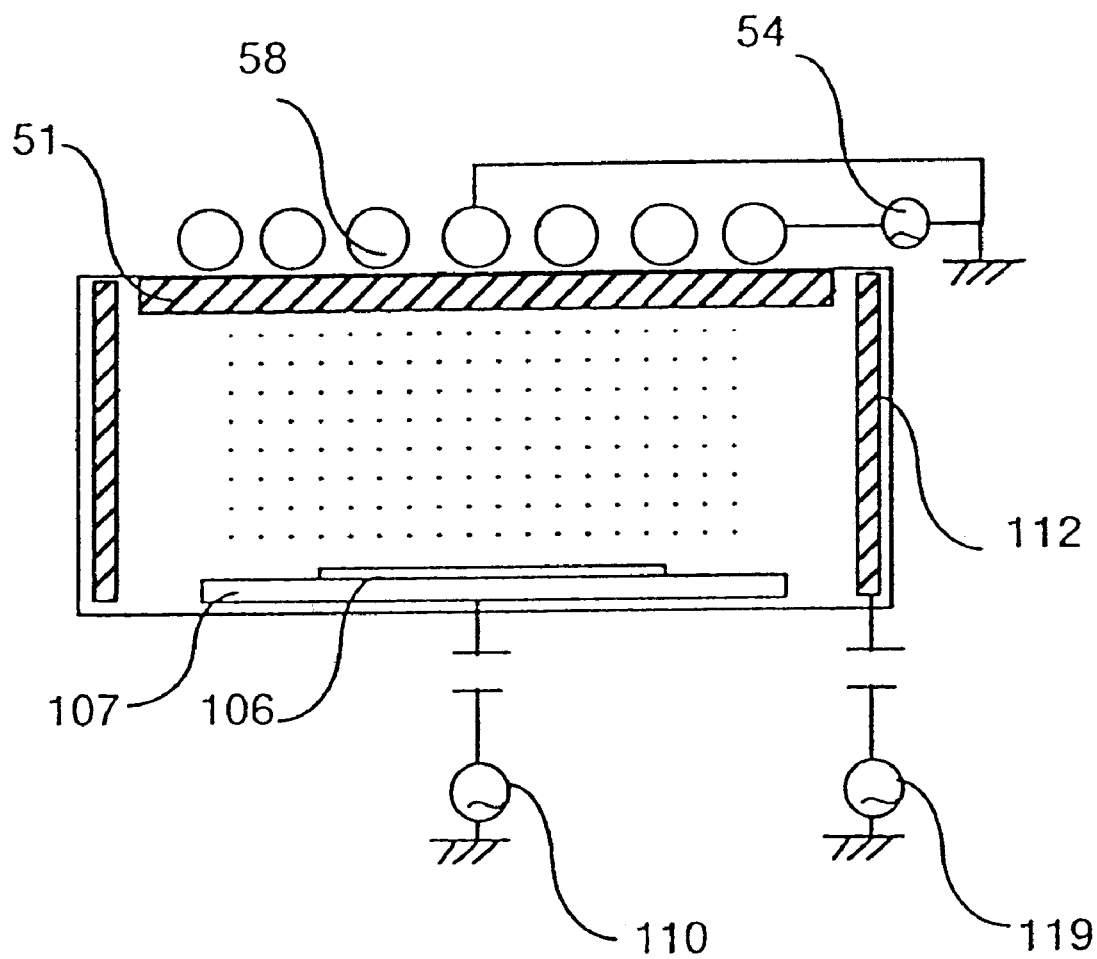
FIG. 13 is a cross section of an etching apparatus according to this invention which applies an induced coupled plasma to the plasma generation system.

The silicon oxide film etching in an induced coupling type RF wave discharge etching apparatus according to this invention will be explained by referring to FIG. 13. The wafer 106 is placed on a wafer table 107 that also serves as a lower electrode for bias RF wave application. The wafer table 107 is connected to a bias RF wave power supply 110. In this embodiment, unlike Embodiments 12–15, there is no electrode opposite the wafer, but an insulation window 51 is provided. SiC as the radical control material 112 is arranged close to the wall. The SiC is connected to a bias power supply 119. As in the Embodiment 14, the total gas flow was set at 20–500 sccm and $SF_6$ was varied in the range of 1–10 sccm. The discharge pressure was set at 0.3–5 Pa. The RF power is supplied from a plasma discharge RF wave power supply 54 to a turn antenna in the discharge section in the plasma chamber to generate a plasma inside a discharge window plate 58 or discharge tube made of alumina or quartz.

Other conditions are similar to those of Embodiment 14. In the above experiment, it was found that, as in the case of Embodiment 14, the etching rate of the resist can be adjusted by the etching rate of the SiC wall electrode to keep a high level of selectivity. The etching rate of the silicon film also changed in a similar manner to that of the resist. It was also found that to realize the most selective etching of the silicon nitride film requires increasing the etching rate of the SiC wall electrode.

Another important finding is that, as in the Embodiment 15, selective etching of the silicon oxide film with respect to the silicon nitride film can be achieved by setting the temperature of the wafer electrode as high as possible.

(Embodiment 17)

The silicon oxide film etching in an UHF wave plasma etching apparatus using no magnetic field, according to this invention will be explained by referring to FIG. 11. This embodiment uses a pyrolytic graphite for the electrode 71 opposite the wafer.

The introduced gas was a mixture of $SF_6$ and Ar; the total gas flow was set at 50–500 sccm; and $SF_6$ was varied in the range of 1–10 sccm. The discharge pressure was set at 0.5–5 Pa. The distance between the upper and lower electrodes was set at 10–200 mm. Surface-treated SiC 76 was arranged close to the wall of the plasma chamber as the radical control mechanism. Supplying power to the SiC causes the SiC to be etched with the plasma.

The wafer to be etched has a silicon nitride film, a silicon film, a silicon oxide film and a photoresist formed in layers over a substrate.

With the etching rate of the pyrolytic graphite of the upper electrode being varied from 50 nm/min to 600 nm/min, the etching rate of oxide film changed from 400 nm/min to 1400 nm/min and the etching rate of the resist film changed from 600 nm/min to 60 nm/min. That is, the etching rate of the resist can be adjusted by the etching rate of the SiC wall electrode to increase the selectivity. The etching rate of the silicon film also changed in the same way as that of the resist. It was found that the etching rate of the SiC wall electrode must be increased to perform the most selective etching of the silicon nitride film.

It is also found that, as with the Embodiment 15, the selective etching of the silicon oxide film with respect to the silicon nitride film can be realized by setting the temperature of the wafer electrode as high as possible.

(Embodiment 18)

Effective use of gas according to this invention will be explained by referring to FIG. 11, for an example of etching a silicon oxide film in an UHF wave plasma etching apparatus using a magnetic field. This embodiment uses $ClF_3$ as a gas not containing carbon. The inert gas used is a mixture of Ne, Ar, Kr and Xe. $ClF_3$, which has a high greenhouse effect coefficient and a long lifetime and is thus not desirable as with the fluorine-containing gas, has the advantage of requiring only a very small consumption. Other conditions are similar to those of Embodiment 17.

The experiment with this embodiment has indicated that even when $ClF_3$ is used, the silicon oxide film can be etched at a high etching rate by controlling the temperature of the radical control material in the range of −60° C. to 250° C., as in the case of the Embodiment 17.

(Embodiment 19)

This embodiment uses a small amount of carbon in addition to $ClF_3$ as the etching gas for etching a silicon oxide film in induced coupling type RF discharge plasma etching equipment.

Because this embodiment is of the induced coupling type, no electrode is placed opposite the wafer. The use of SiC for the electrode 112 near the wall (FIG. 13) is found to improve the etching performance. However, it is very difficult to perform selective etching of the silicon oxide film with respect to the silicon nitride film. This embodiment is intended to compensate for this drawback. The carbon-containing gas need only include H, F or Cl in addition to C.

The total gas flow was set at 20–500 sccm and $ClF_3$ was varied in the range of 0–10 sccm. A trace amount of chloroform was used as an additive gas and the amount of chloroform introduction was set at a level not exceeding the amount of $ClF_3$. The discharge pressure was set at 0.3–5 Pa. RF power was supplied to a turn antenna in the discharge section in the plasma chamber to generate a plasma inside the discharge window plate or discharge tube made of alumina or quartz. The wafer electrode was supplied with an RF power to accelerate ions in the plasma.

The wafer used has a silicon nitride film, a silicon film, a silicon oxide film and a photoresist formed in layers over a substrate.

When the etching rate of SiC was varied from 50 nm/min to 600 nm/min, the etching rate of the oxide film changed from 400 nm/min to 1600 nm/min and the etching rate of the resist film changed from 500 nm/min to 60 nm/min. The etching rate of the silicon nitride was 40–200 nm/min. Adding chloroform improved the selectivity by more than 20%, demonstrating the significant effect that a small amount of gas additive has on the etching performance and also the effectiveness of this invention. That is, by adding a small amount of carbon-containing gas, the etching rate of the resist can be adjusted, thereby increasing the selectivity. The effective range of the carbon-containing gas flow is 1% or less, preferably about 0.4–0.8%, of the total gas flow. That is, this embodiment can produce the above-mentioned effect if 5 sccm or less of the carbon-containing gas is introduced. The etching rate of the silicon film also changed in a similar way to that of the resist. The silicon nitride film was able to be etched very effectively and selectively.

Under this condition, the temperatures of the upper and lower electrodes and the wall electrode were varied from $-60°$ C. to $250°$ C. to investigate the effect the temperature has on the etching performance. The investigation has found that, for the silicon oxide film to be etched selectively with respect to the silicon nitride film, the temperature of the wafer electrode may be about $10°$ C. lower when the carbon-containing gas is introduced than when it is not. A particularly preferred temperature was $-10°$ C. or higher. The temperature of the upper electrode was one of the factors that determine the etching rate of the electrode surface. Hence, the temperature must be kept as constant as practically possible. Further, it was also found that the higher the temperature, the faster the etching rate and that setting the temperature low degrades the efficiency of the transformation reaction by the upper electrode of the reactive species. Thus, in the above temperature ranges, a desired etching rate can be set. As for the wall electrode, reaction products easily deposit on its surface at low temperatures. As in the case of the upper electrode, the temperature was found to constitute one of the factors that determine the etching rate on the electrode surface. Hence, the temperature needs to be kept as constant as practically possible. It was also found that the higher the temperature, the faster the etching rate and that setting the temperature low reduces the efficiency of the transformation reaction by the upper electrode of the reactive species. Thus, in the above temperature ranges, a desired etching rate was able to be set. This embodiment has thus demonstrated that when $ClF_3$ is used as a gas not containing carbon and H, F or Cl is used in addition to C as a carbon-containing gas, this invention can etch a silicon oxide film at a high etching rate with a high selectivity by including carbon in a solid surface contacting the plasma, by causing this solid to perform an etching reaction, and by controlling the temperature of the solid in a range of $-60°$ C. to $240°$ C. This has verified the effectiveness of this invention.

(Embodiment 20)

Effective use of gas according to this invention will be explained for an example of etching a silicon oxide film in an induced coupling type RF discharge plasma etching apparatus. This embodiment uses $ClF_3$ as an etching gas and also an oxygen-containing gas, such as $O_2$. In addition to these gases, a small amount of carbon-containing gas used in the Embodiment 19 may also be used. The inert gas used is a mixture of Ne, Ar, Kr or Xe. As a fluorine-containing gas $OF_6$, $NF_3$ and $ClF_3$ may be used. A key point of this embodiment is that $O_2$, CO, $CO_2$, NO, $NO_2$ and $H_2O$ can he used.

It was observed that the use of a pyrolytic graphite for the wall electrode has contributed to an improved etching performance. It is, however, very difficult to perform selective etching on the silicon oxide film with respect to the silicon nitride film. This embodiment is intended to compensate for this drawback. The carbon-containing gas may be a gas containing H, F or Cl in addition to C.

The total gas flow was set at 20–500 sccm and $ClF_3$ was varied in the range of 1–10 sccm. A small amount of $O_2$ gas, not exceeding the amount of $ClF_3$, was added. The discharge pressure was set at 0.5–5 Pa. RF power was supplied to a turn antenna in the discharge section in the plasma chamber to generate a plasma inside the discharge window plate or discharge tube made of alumina or quartz. The wafer electrode was supplied with RF power to accelerate ions in the plasma. Unlike the preceding embodiments, this embodiment produces carbon oxide gases such as CO, $CO_2$, $C_3O_2$, and $C_5O_2$ as a result of the etching reaction. These gases are extremely desirable for selective etching of a silicon oxide film with respect to a silicon nitride film, further enhancing the effectiveness of this invention.

The wafer used has a silicon nitride film, a silicon film, a silicon oxide film and a photoresist formed in layers over the substrate.

With the etching rate of the graphite of the upper electrode varied from 50 nm/min to 600 nm/min, the etching rate of the oxide film changed from 400 nm/min to 1600 nm/min and the etching rate of the resist film changed from 500 nm/min to 60 nm/min. The etching rate of the silicon nitride film was 30–150 nm/min. The selectivity improved more than 15% by the addition of oxygen, verifying that a small amount of gas additives has a significant effect on the etching performance. This embodiment further demonstrated the effectiveness of this invention. In other words, the addition of a small amount of oxygen-containing gas can adjust the etching rate of the resist and increase the selectivity. The etching rate of the silicon film also changed in the same manner as that of the resist. The silicon nitride film was able to be etched highly effectively and with high selectivity.

While the above embodiment uses pyrolytic graphite and SiC as the carbon-containing materials, other carbon-containing materials may be used, such as organic resin film, SiCN, diamond plate, $Al_4C_3$ and boron carbide. Similar effects were obtained when these carbides were formed on the surface of the chamber.

Although the above embodiment uses Ar as a gas not containing carbon, other inert gases may be used, such as Ne, Kr and Xe.

The above embodiment uses $SF_6$ and $ClF_3$ as a fluorine-containing gas. These gases, though they have a high greenhouse effect coefficient and a long lifetime and are thus not desirable, have an advantage of requiring only a very small amount of consumption. Other gases that may be used include $F_2$, HF, $XeF_2$, $PF_3$, $BF_3$, $NF_3$, $SiF_4$, and halides such as fluorine chloride ClF, fluorine bromides BrF, $BrF_3$ and $BF_5$ and fluorine iodide $IF_5$.

Effect of the Invention

Advantages of this invention may be summarized as follows.

Without using PFC and HFC gases, it is possible to generate reactive species necessary for etching and perform etching of a silicon oxide film while maintaining the same level of selectivity as offered by the conventional etching equipment.

In the silicon oxide film etching process, fluorine in the plasma is converted into $CF_2$, transforming reactive species in the plasma into one desired species. The use of this plasma with a single reactive species enhances selectivity, whereby etching proceeds on the silicon oxide film with reaction products evaporated, whereas, on the silicon nitride film, etching is stopped by residual matters. This eliminates a problem of shoulder erosion in the nitride film due to deteriorated selectivity and of increased process margin.

Further, the density of a reactive species can be maintained nearly constant between different materials during metal etching, minimizing localized abnormal deformations or notching.

Because deposits on the plasma boundary surface can be removed, variations in etching characteristic can be minimized, assuring high throughput and a satisfactory stable etching characteristic.

What is claimed is:

1. A plasma processing method comprising the steps of:
introducing a gas into a reaction chamber;
applying a voltage to a solid material made of a specified substance and placed in the reaction chamber;
ionizing the gas to form a plasma for reaction with the solid material; and
processing a workpiece with the plasma in the reaction chamber,
wherein the workpiece is covered with a mask in a desired area, and a surface area of a part of the solid material in contact with the Plasma is larger than the covered or uncovered surface area of the workpiece, whichever is smaller.

2. A plasma processing method comprising the steps of:
introducing a gas into a reaction chamber;
applying an electric power to at least one of two or more isolated blocks of solid material installed in the reaction chamber;
ionizing the gas to form a plasma for reaction with the solid material; and
processing a workpiece with the plasma in the reaction chamber.

3. A plasma processing method according to claim 2, wherein different valves of electric power are applied to different blocks of the solid material.

4. A plasma processing method according to claim 2, wherein the two or more blocks are made of the same material.

5. A plasma processing method according to claim 2, wherein one of the blocks is supplied with a first voltage and the other block is grounded.

6. A plasma processing method according to claim 2, wherein RF voltages of different phases are applied to the at least two blocks.

7. A plasma processing method comprising the steps of:
introducing a gas into a reaction chamber;
applying a voltage whose DC component is 0 V or lower to a solid material of a specified substance placed in the reaction chamber;
producing a plasma by causing a reaction between the gas and the solid material; and
processing a workpiece with the plasma in the reaction chamber.

8. A plasma processing method according to claim 7, wherein the voltage has a DC component of −20 V or lower.

9. A plasma processing method according to claim 7, wherein the voltage has a DC component of −50 V or higher.

10. A plasma processing method comprising the steps of:
introducing a gas into a reaction chamber;
ionizing the gas to form a plasma and applying a voltage to a solid material of a specified substance placed in the reaction chamber and causing the gas and the solid material to react with each other, the solid material being controlled in temperature by a temperature control means;
detecting an amount of a specified reactive species in the plasma and controlling the voltage according to the detected amount of the reactive species; and
processing a workpiece with the plasma in the reaction chamber.

11. A plasma processing method according to claim 10, wherein the solid material is controlled in a temperature range of between −60° C. and 250° C.

12. A plasma processing method according to claim 11, wherein the temperature is −10° C. or higher.

13. A plasma processing method according to claim 11, wherein the temperature is 0° C. or higher.

14. A plasma processing method according to claim 10, wherein the temperature is adjusted by a heater and a cooling pipe.

15. A plasma processing method according to claim 10, wherein the solid material is supplied with a predetermined voltage.

16. A plasma processing method comprising the steps of:
introducing a gas into a reaction chamber;
ionizing the gas to form a plasma, applying a voltage to a solid material of a specified substance placed in the reaction chamber and causing the gas and the solid material to reach with each other;
detecting an increase or decrease in the amount of the substance from the solid material and controlling the voltage according to the detected increase or decrease; and
processing a workpiece with the plasma in the reaction chamber.

17. A plasma processing method comprising the steps of:
introducing a gas into a reaction chamber;
ionizing the gas to form a plasma, applying a voltage to a solid material of a specified substance placed in the reaction chamber and causing the gas and the solid material to react with each other;
detecting an amount of a specified reactive species in the, plasma and controlling the voltage according to the detected amount of the reactive species; and
processing a workpiece with the plasma in the reaction chamber.

18. A plasma processing method according to claim 17, wherein the workpiece and the solid material contain common atoms.

19. A plasma processing method according to claim 17, wherein the workpiece is covered with a mask, and the mask and the solid material contain common atoms.

20. A plasma processing method according to claim 17, wherein the solid material contains at least one of carbon, Si, polysilicon, $Si_3N_4$, W, Al, Cu, Pt, $SiO_2$ and TiN.

21. A plasma processing method according to claim 20, wherein the solid material containing carbon is one of graphite, organic resin, SiCN, diamond, $Al_4C_3$ and boron carbide.

22. A plasma processing method according to claim 17, wherein the voltage is a DC voltage.

23. A plasma processing method according to claim 17, wherein the voltage is a pulse voltage.

24. A plasma processing method according to claim 23, wherein a frequency of the voltage is in the range of between 100 kHz and 100 MHz.

25. A plasma processing method according to claim 17, wherein the voltage is an AC voltage.

26. A plasma processing method according to claim 9, wherein the frequency of the voltage is in the range of between 100 kHz and 100 MHz.

27. A plasma processing method according to claim 1, wherein the reaction between the gas and the solid material is a reaction for consuming a specified reactive species in the plasma by the solid material.

28. A plasma processing method comprising the steps of:
  introducing a gas into a reaction chamber;
  ionizing the gas to form a plasma, applying a voltage to a solid material of a specified substance placed in the reaction chamber and causing the gas and the solid material to reach with each other; and
  detecting a length of time that a workpiece placed in the reaction chamber is to be processed by the plasma and, based on the detected time, controlling the voltage.

29. A plasma processing apparatus comprising:
  a container accommodating a workpiece;
  a holder on which to mount the workpiece;
  a gas introducing port for introducing a gas used to process the workpiece;
  means to ionize the gas to produce a plasma;
  an exhaust port to exhaust the gas;
  a solid material placed in the container and supplied with a predetermined electric power;
  a detector to detect a change in the amount of reactive species in the plasma; and
  an electric circuit to control the electric power based on an output of the detector.

30. A plasma processing apparatus comprising:
  a container accommodating a workpiece;
  a holder on which to mount the workpiece;
  a gas introducing port for introducing a gas used to process the workpiece;
  means to ionize the gas to produce a plasma;
  an exhaust port to exhaust the gas;
  a solid material placed in the container;
  a system to adjust the temperature of the solid material;
  a detector to detect a change in the amount of reactive species in the plasma; and
  an electric circuit to control the electric power based on an output of the detector.

* * * * *